United States Patent
Ditto et al.

(10) Patent No.: US 7,863,937 B2
(45) Date of Patent: Jan. 4, 2011

(54) LOGIC BASED ON THE EVOLUTION OF NONLINEAR DYNAMICAL SYSTEMS

(75) Inventors: William L. Ditto, Gainesville, FL (US); Krishnamurthy Murali, Gainesville, FL (US); Sudeshna Sinha, Chennai (IN); Abraham Miliotis, Gainesville, FL (US)

(73) Assignees: University of Florida Research Foundation, Inc., Gainesville, FL (US); Control Dynamics, Inc., Bellevue, WA (US)

( * ) Notice: Subject to any disclaimer, the term of this patent is extended or adjusted under 35 U.S.C. 154(b) by 31 days.

(21) Appl. No.: 12/394,991

(22) Filed: Feb. 27, 2009

(65) Prior Publication Data

US 2010/0219858 A1     Sep. 2, 2010

Related U.S. Application Data

(63) Continuation-in-part of application No. 12/174,332, filed on Jul. 16, 2008, which is a continuation of application No. 11/304,125, filed on Dec. 15, 2005, now Pat. No. 7,415,683, which is a continuation of application No. 10/680,271, filed on Oct. 7, 2003, now Pat. No. 7,096,437.

(51) Int. Cl.
*H03K 19/20* (2006.01)

(52) U.S. Cl. .................................. 326/104; 326/38

(58) Field of Classification Search ............. 326/37–41, 326/46–47, 104
See application file for complete search history.

(56) References Cited

U.S. PATENT DOCUMENTS

| | | | |
|---|---|---|---|
| 3,473,160 A | | 10/1969 | Wahlstrom |
| 5,007,087 A | * | 4/1991 | Bernstein et al. .............. 380/46 |
| 5,260,610 A | | 11/1993 | Pedersen et al. |
| 5,291,555 A | * | 3/1994 | Cuomo et al. ............... 380/263 |
| 5,504,841 A | | 4/1996 | Tani |
| 5,745,655 A | * | 4/1998 | Chung et al. .................. 706/33 |
| 5,809,009 A | | 9/1998 | Matsuoka et al. |

(Continued)

OTHER PUBLICATIONS

Murali, et al., "Realization of the fundamental NOR gate using a chaotic circuit," Physical Review 68:1-5, 2003.

(Continued)

*Primary Examiner*—James H. Cho
*Assistant Examiner*—Jason Crawford
(74) *Attorney, Agent, or Firm*—Jon A. Gibbons; Fleit Gibbons Gutman Bongini & Bianco PL

(57) ABSTRACT

A logic gate implements logical expressions. A least one logic gate input receives at least one input logic gate signal and at least one control signal. At least one output for produces a logic gate output signal. A nonlinear updater operates as a dynamically configurable element to produce a plurality of different logic gates as selected by the control signal. The nonlinear updater includes a nonlinear updater output. The nonlinear updater is configured to apply a nonlinear function to the input logic gate signal to produce the nonlinear updater output signal representing a logical expression being implemented by one of the plurality of different logic gates on the input logic gate signal. A comparator includes a comparator input that is adapted to receive a reference threshold value for producing the logical gate output signal based on a comparison of the nonlinear output signal to the reference threshold value.

17 Claims, 16 Drawing Sheets

U.S. PATENT DOCUMENTS

| | | | |
|---|---|---|---|
| RE35,977 | E | 12/1998 | Cliff et al. |
| 6,014,445 | A * | 1/2000 | Kohda et al. ............... 380/28 |
| 6,025,735 | A | 2/2000 | Gardner et al. |
| 6,850,252 | B1 | 2/2005 | Hoffberg |
| 6,876,232 | B2 | 4/2005 | Yoo |
| 7,068,069 | B2 | 6/2006 | Fujita |
| 7,453,285 | B2 * | 11/2008 | Kiel et al. ............... 326/38 |
| 2003/0216919 | A1 | 11/2003 | Roushar |
| 2004/0036636 | A1 | 2/2004 | Mai et al. |
| 2005/0073337 | A1 * | 4/2005 | Ditto et al. ............... 326/38 |
| 2006/0091905 | A1 * | 5/2006 | Ditto et al. ............... 326/41 |
| 2008/0150578 | A1 * | 6/2008 | Kiel et al. ............... 326/38 |
| 2008/0278196 | A1 * | 11/2008 | Ditto et al. ............... 326/38 |

OTHER PUBLICATIONS

Murali, et al., "Implementation of NOR Gate by a Chaotic CHUA's Circuit," Unpublished.

Munakata et al., "Chaos Computing: lmplementaion of Fundamental Logical Gates by Chaotic Elements," IEEE Transactions on Circuits and Systems-I: Fundamental Theory and Applications, 49:1629-1633, 2002.

Murali, et al., "Experimental Chaos Computing," Submitted to IEE 'Trans. On Circuits and Systems, Manuscript Received May 30, 2003.

Murali, et al., "Logic from Nonlinear Dynamical Evolution," To be published in Mar. 6, 2009 issue of Physical Review Letters.

Murali, et al., Reliable Logic Circuit Elements that Exploit Nonlinearity in the Presence of a Noise-Flloor,: Currently Unpublished.

Sinha, et al., "Computing with Distributed Chaos," The American Physical Society, Copyright 1999; 1063-651X/99/60(1)/363(15).

Sinha, et al., "Flexible parallel implementation of logic gates using chaotic elements," Physics Review E, vol. 65, Issue 3, Phys.Rev. E65, 036216.

International Search Report dated Jul. 13, 2005 for PCT/US04/33108.

* cited by examiner

LOGIC BASED ON THE EVOLUTION OF NONLINEAR DYNAMICAL SYSTEMS

CROSS-REFERENCE TO RELATED APPLICATIONS

This application is continuation-in-part and based upon and claims priority from prior U.S. patent application Ser. No. 12/174,332 filed Jul. 16, 2008, which is a continuation of and claims priority from U.S. patent application Ser. No. 11/304,125 filed Dec. 15, 2005, now U.S. Pat. No. 7,415,683, which is a continuation of and claims priority from U.S. patent application Ser. No. 10/680,271 filed on Oct. 7, 2003, now U.S. Pat. No. 7,096,437, the entire disclosure of each application is incorporated by reference in their entirety.

STATEMENT REGARDING FEDERALLY SPONSORED RESEARCH OR DEVELOPMENT

The present invention was made with government support, in part, by the Office of Naval Research under grant N00014-02-1-1019. The Government has certain rights in this invention.

FIELD OF THE INVENTION

The present invention generally relates to the field of dynamic computing, and more particularly relates to logic operations based on a dynamical evolution of a nonlinear system.

BACKGROUND OF THE INVENTION

Recently there has been a new theoretical direction in harnessing the richness of nonlinear dynamics, namely the exploitation of chaos to do flexible computations. This so-called chaos computing paradigm is driven by the motivation to use new concepts of physics to build better computing devices. The chaos computing paradigm is further discussed in S. Sinha, W. L. Ditto, Phys Rev Lett. 81 (1998) 2156; Phys. Rev. E 60 (1999) 363; S. Sinha, T. Munakata, W. L. Ditto, Phys Rev E 65 (2002) 036216; K. Murali, S. Sinha, W. L. Ditto, Int. J. of Bifur. Chaos Appl. Sci. Eng. 13 (2003) 2669; Phys Rev E 68 (2003) 016205; K. Murali, S. Sinha, I. Raja Mohamed, Phys. Lett. A 339 (2005) 39; K. E. Chlouverakis, M. J. Adams, Electronics Lett. 41 (2005) 359; D. Cafagna, G. Grassi, Int. Sym. Signals, Circuits and Systems (ISSCS 2005) 2 (2005) 749; M. R. Jahed-Motlagh, B. Kia, W. L. Ditto, S. Sinha, Int. J. of Bifur. Chaos Appl. Sci. Eng. 17 (2007) 1955; K. Murali, S. Sinha, Phys Rev E 75 (2007) 025201(R); and B. Prusha, J. Lindner, Phys. Lett. A 263 (1999) 105, which are hereby incorporated by reference in their entireties.

The general strategy underlying this research activity exploits the determinism of dynamics on one hand, and its richness on the other. The determinism allows one to reverse engineer, so to speak, and the richness of dynamical patterns allows flexibility and versatility in accomplishing wide-ranging operations. This novel paradigm forms part of the overarching attempt to find new ways to exploit physical phenomena that are well understood in the context of physics, to do computations, and in particular to bridge dynamical phenomena and computations (See, for example, J. P. Crutchfield, K. Young, Phys. Rev. Lett. 63 (1989) 105; J. P. Crutchfield, Physica D 75 (1994) 11; N. Margolus, Physica D 10 (1984) 81; T. Toffoli, N. Margolus, "Cellular Automata Machines: A New Environment for Modelling", MIT Press (1987); T. Toffoli, N. Margolus, Physica D 47 (1990) 263; C. Moore, Phys. Rev. Lett. 64 (1990) 2354; A. V. Holden, J. V. Tucker, H. Zhang, M. J. Poole, Chaos 2 (1992) 367; A. Toth, K. J. Showalter, J. Chem. Phys. 103 (1995) 2058; M. M. Mano, "Computer System Architecture", $3^{rd}$ Ed. Prentice Hall, Englewood Cliffs, N.J. (1993); and T. C. Bartee, "Computer Architecture and Logic Design", McGraw-Hill, New York, (1991), which are hereby incorporated by reference in their entireties).

The fundamental components of computer architecture today are the logical AND, OR, NOT, and XOR operations, from which we can directly obtain basic operations like bit-by-bit addition and memory (See, for example, T. C. Bartee, "Computer Architecture and Logic Design", McGraw-Hill, New York, (1991)). A typical 2-input operation act on two inputs $I_1$ and $I_2$ and outputs a signal O. The type of logic is defined by patterns of input-to-output mapping represented by the truth table in Table I. Now all the above mentioned gates can be constructed by combining the NOR or NAND operations (See, for example, T. C. Bartee, "Computer Architecture and Logic Design", McGraw-Hill, New York, (1991)). Clearly though, this conversion process is inefficient in comparison with direct implementation, considering perhaps that such fundamental operations may be performed a large number of times.

SUMMARY OF THE INVENTION

In one embodiment, a logic gate for implementing logical expressions is disclosed. A least one logic gate input receives at least one input logic gate signal and at least one control signal. At least one output for produces a logic gate output signal. A nonlinear updater operates as a dynamically configurable element to produce a plurality of different logic gates as selected by the control signal. The nonlinear updater is electrically coupled to the logic gate input and comprises a nonlinear updater output. The nonlinear updater is configured to apply a nonlinear function to the input logic gate signal in response to the control signal to produce the nonlinear updater output signal representing a logical expression being implemented by one of the plurality of different logic gates on the input logic gate signal. A comparator is electrically coupled to the output of the logic gate and the output of the nonlinear updater. The comparator comprises a comparator input adapted to receive a reference threshold value for producing the logical gate output signal based on a comparison of the nonlinear output signal to the reference threshold value.

In another embodiment, a logic gate for implementing a full adder is disclosed. The logic gate comprises a first logic gate input for receiving a first logic gate input signal. At least a second logic gate input receives at least a second logic gate input signal. A control signal input receives at least one control signal. A first output produces a first logic gate output signal. At least a second output produces a second logic gate output signal. A first nonlinear updater operates as a dynamically configurable element to produce a plurality of different logic gates as selected by the control signal. The first nonlinear updater is electrically coupled to the logic gate input and comprises a first nonlinear updater output. The first nonlinear updater is configured to apply a first nonlinear function to the input logic gate signal in response to the control signal to produce the first nonlinear updater output signal representing. A logical expression is implemented by one of the plurality of different logic gates on the first input logic gate signal.

A first comparator is electrically coupled to the first output and the first nonlinear updater output. The first comparator comprises a first comparator input that is adapted to receive a reference threshold value for producing the first logic gate output signal based on a comparison of the first nonlinear output signal to the reference threshold value. At least a second nonlinear updater is electrically coupled to the first nonlinear output signal. The second nonlinear updater operates as a dynamically configurable element to produce a plurality of different logic gates as selected by the control signal. The second nonlinear updater comprising a second nonlinear updater output, and configured to apply a second nonlinear function to the first nonlinear updater output signal in response to the control signal to produce a second nonlinear updater output signal representing a logical expression being implemented by one of the plurality of different logic gates on the second input logic gate signal. At least a second comparator is electrically coupled to the second out and the second nonlinear updater output. The second comparator comprises a second comparator input adapted to receive a reference threshold value for producing the second logic gate output signal based on a comparison of the second nonlinear output signal to the reference threshold value.

In yet another embodiment, a method of changing functionality of a logic gate is disclosed. At least one input logic gate signal and at least one control signal is received. A nonlinear updater operates as a dynamically configurable element to produce a plurality of different logic gates as selected by the control signal. A nonlinear function is applied to the input logic gate signal in response to the control signal. A nonlinear updater output signal representing a logical expression being implemented by one of the plurality of different logic gates on the input logic gate signal is produced in response to the applying. A comparator electrically coupled to an output of the logic gate and an output of the nonlinear updater is operated. The comparator comprises an input adapted to receive a reference threshold value. The nonlinear output signal is compared to the reference threshold value in response to the operating. A logical gate output signal is produced in response to the comparing.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
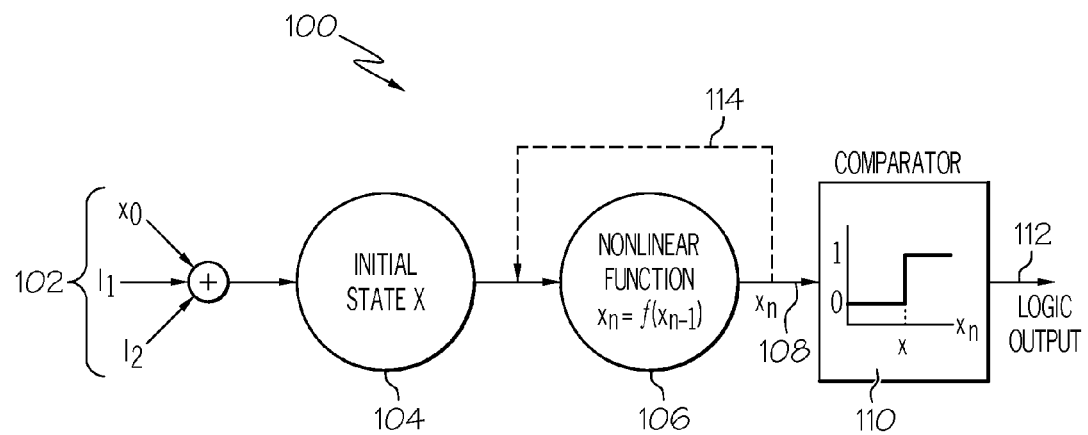
FIG. 1 is a schematic diagram of nonlinear evolution based logic operations according to one embodiment of the present invention.

As required, detailed embodiments of the present invention are disclosed herein; however, it is to be understood that the disclosed embodiments are merely examples of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure and function. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

The following embodiments provide a direct and flexible implementation of logic operations using the dynamical evolution of a nonlinear system. The various embodiments observer the state of the system at different times to obtain different logic outputs. The basic NAND, AND, NOR, OR and XOR logic gates are implemented, as well as multiple-input XOR and XNOR logic gates. The single dynamical system can perform more complex operations such as bit-by-bit addition in just a few iterations.

The direct and flexible implementation of gates is useful and could prove very cost effective. The various embodiments of the present invention yield the appropriate outputs, for the different fundamental gates, for all possible sets of inputs. The following discussion shows the direct and flexible implementation of all these logical operations utilizing low dimensional chaos. In some embodiments, a single nonlinear element is used to emulate different logic gates and perform different arithmetic tasks, and further have the ability to switch easily between the different operational roles. Such a reconfigurable logic unit may then serve as an ingredient for the construction of general purpose reprogrammable hardware.

Arrays of such morphing logic gates can conceivably be programmed on the run (for instance, by an external program) to be optimized for the task at hand. For instance, they may serve flexibly as an arithmetic processing unit or a unit of memory, and can be swapped, as the need demands, to be one or the other. Applications of such reconfigurable hardware includes digital signal processing, software-defined radio, aerospace and defense systems, ASIC prototyping, medical imaging, computer vision, speech recognition, cryptography, bioinformatics, computer hardware emulation and a growing range of other areas. Further advantages of reconfigurable hardware include the ability to re-program in the field, to fix bugs, lower non-recurring engineering costs and implement coarse-grained architectural approaches (See, for example, G. Taubes, Science 277 (1997) 1935, which is hereby incorporated by reference in its entirety).

Additionally, the various embodiments of the present invention obtain logic output from a nonlinear system using the time evolution of the state of the system. For example, the various embodiments utilize the nonlinear characteristics of the time dependence of the state of the dynamical system to extract different responses from the system at different time instances. Therefore, a single nonlinear system is capable of yielding a time sequence of logic operations. The following discussion demonstrates the implementation of sequences of fundamental logic gates, as well as the direct implementation of bit-by-bit addition through such a sequence.

Previous results in chaos computing have shown that a single nonlinear dynamical system can (with proper tuning of parameters and control inputs) become any logic gate. Additionally it has been shown that such nonlinear dynamical systems can be morphed to become any logic gate (See, for example, T. Munakata, S. Sinha, and W. L. Ditto, IEEE Trans on Circuits and Systems 149, 1629 (2002), S. Sinha, and W. L. Ditto, Phys Rev Lett. 81, 2156 (1998), and S. Sinha, and W. L. Ditto, Phys Rev E 60, 363 (1999), which are hereby incorporated by reference in their entireties.). The various embodiments of the present invention result in the varied temporal patterns embedded in the dynamical evolution of nonlinear systems being capable of performing sequences of logic operations in time (or iterates), which is in contrast to previous results un chaos computing. Thus, minimal control is required and the various embodiments only invoke a control mechanism on initialization. The various embodiments then only need to monitor the state and the morphing between gates that takes place in time evolution instead of varying the control parameters. So one can set a global parameter and let time evolve the logic, rather than micromanage each morphing step through a separate parameter change. This approach has the potential to lead to enhanced flexibility in the morphing ability of a nonlinear computing device.

The implementation of a sequence of logic functions in time, as described above, is now another mechanism through which computer architectures based upon the chaos computing approach can be optimized for better performance. In particular, the following discussion shows how multiple sequentially connected nonlinear maps with unidirectional coupling (through state variables) or successive iterations of a single nonlinear map can perform bit-by-bit arithmetic addition through a sequence of logic operations with a small number of elements. With these fundamental ingredients in hand it is conceivable to build simple, fast, cost effective, and general-purpose computing devices, which are more flexible than statically wired hardware. It becomes clear that exploiting not just the pattern formation of nonlinear dynamical systems, but the formation of sequences of such patterns, produced naturally by such systems, may prove to be a key ingredient towards making nonlinear dynamical computational architectures a real alternative to conventional static logic computer architectures.

Generation of a Sequence of Logic Operations Using Iterates of a Chaotic Map

In one embodiment, all basic logic gates can be obtained using different dynamical iterates of a single nonlinear system. In particular consider a chaotic system whose state is represented by a value x. The state of the system evolves according to some dynamical rule. For instance, the updates of the state of the element from time n to n+1 may be well described by a map, i.e., $x_{n+1} = f(x_n)$, where $f$ is a nonlinear function. Now this element receives inputs before the first iteration (i.e., n=0) and outputs a signal after evolving for a (short) specified time or number of iterations.

In one embodiment, all the basic logic gate operations, NAND, AND, NOR, XOR and OR (see Table I for the truth table), involve the following steps:

(1) Inputs (for a 2 inputs operation):

$$x \to x_0 + I_1 + I_2$$

where $x_0$ is the initial state of the system, and I=0 when logic input is zero, and I=δ (where δ is some positive constant) when logic input is one. Therefore, the following situations are to be considered:

Case 1. Both $I_1$ and $I_2$ are 0 (row 1 in Table I) i.e., the initial state of the system is $x_0+0+0=x_0$ Case 2. Either $I_1=1, I_2=0$ or $I_1=0, I_2=1$ (row 2 or 3 in Table I) i.e., the initial state is $x_0+0+\delta=x_0+\delta+0=x_0+\delta$ Case 3. Both $I_1$ and $I_2$ are 1 (row 4 in Table I), i.e., the initial state is $x_0+\delta+\delta=x_0+2\delta$.

The next steps are:

(2) Chaotic updates over some prescribed number of steps, i.e., $x \to f_n(x)$, where $f_n(x)$ is the nth iterate of the evolution of the function $f(x)$; and (3) The evolved state $f_n(x)$ yields a logic output at iteration n as follows:

Logic Output=0 if $f(x) \leq x^*$,

Logic Output=1 if $f(x) > x^*$, where $x^*$ is a reference threshold value.

TABLE I

| Input | NAND | AND | NOR | XOR | OR |
|---|---|---|---|---|---|
| (0, 0) | 1 | 0 | 1 | 0 | 0 |
| (0, 1) | 1 | 0 | 0 | 1 | 1 |
| (1, 0) | 1 | 0 | 0 | 1 | 1 |
| (1, 1) | 0 | 1 | 0 | 0 | 1 |

Since the system is chaotic, in order to specify the initial $x_0$ accurately one needs a controlling mechanism. For instance one can employ a threshold controller to set the initial value $x_0$. The action of threshold control or limit control is to clip the state of a system to some prescribed value. The theory and experimental verification of this efficient control method is given in S. Sinha, Phys. Rev. E 49 (1994) 4832; S. Sinha, Phys. Rev. E 63 (2001) 036212; S. Sinha, W. L. Ditto, Phys. Rev. E 63 (2001) 056209; S. Sinha, in "Nonlinear Systems", Eds. R. Sahadevan and M. Lakshmanan, Narosa (2002) 309; and K. Murali, S. Sinha, Phys. Rev. E 68 (2003) 016210, which are hereby incorporated by reference in their entireties.

It should be noted that the state of the system can be reset to $x_0$ at any time using such a controller, and after that the system can be 're-used' as another logic gate, as the situation demands. For logic recovery, the updated or evolved value of $f(x)$ is compared with $x^*$ value using a comparator action as shown in FIG. 1. This recovered output can be properly rescaled to match with input logic levels in-terms of δ, so that further concatenating these logic gates is possible. In particular, FIG. 1 shows a high level overview of a system 100 comprising a set of inputs 102; an initial state x 104; a nonlinear function 106 that generates an output 108 based on the initial state 106; and a comparator 110 that generates a logic output 112 based on the output 108 of the nonlinear function.

FIG. 1 illustrates nonlinear evolution based logic operations. The dotted line 114 denotes successive iteration operation with update values $x_n$ for n>1. The logic output 112 is recovered from $x_n$ using a comparator with reference value $x^*$.

In order to obtain all the desired input-output responses of the different gates, as displayed in Table I, the conditions enumerated in Table II are to be satisfied simultaneously. Note that the symmetry of inputs reduces the four conditions in the truth Table I to three distinct conditions, with rows 2 and 3 of Table I leading to condition 2 in Table II. In particular, Table II shows the necessary and sufficient conditions that are to be satisfied by a chaotic element in order to implement the logical operations NAND, AND, NOR, XOR and OR during different iterations. Here $x_0=0.325$ and $\delta=0.25$. $x^*=0.75$ is used for NAND, AND, NOR, XOR logic operations and $x^*=0.4$ is fixed for OR logic operation.

(0<n<5) can be identified from this diagram. It should be noted that the first 5 iterations satisfy the realization of basic logic gates as indicated in Table I. In addition, subsequent iterations beyond n>5 continue to yield different logic gate operations including XNOR operation. It has been observed that while the system will always yield some logic behavior, the robustness of the response, with respect to initial state specification is lost after n around 5 or so. This is expected from the chaotic nature of the dynamics, and so for large n the response is extremely sensitive to the precision with which $x_0$ is set. However note that one need not go to iterates beyond 5 or so, as all basic logic outputs can be obtained within the first few iterates, in large robust ranges of initial state $x_0$. After n around 5 or so, the system can be re-set, for instance by the threshold controller mentioned earlier, and the nonlinear system can be 're-used' after this re-initialization.

TABLE II

| | LOGIC | | | | |
|---|---|---|---|---|---|
| | NAND | AND | NOR | XOR | OR |
| | | | Iteration 'n' | | |
| | 1 | 2 | 3 | 4 | 5 |
| Condition 1: Logic input (0, 0) $x_0 = 0.325$ | $x_1 = f(x_0) > x^*$ $x_1 = 0.88$ | $f(x_1) < x^*$ $x_2 = 0.43$ | $f(x_2) > x^*$ $x_3 = 0.98$ | $f(x_3) < x^*$ $x_4 = 0.08$ | $f(x_4) < x^*$ $x_5 = 0.28$ |
| Condition 2: Logic input (0, 1) or (1, 0) $x_0 = 0.575$ | $x_1 = f(x_0 + \delta) > x^*$ $x_1 = 0.9775$ | $f(x_1) < x^*$ $x_2 = 0.088$ | $f(x_2) < x^*$ $x_3 = 0.33$ | $f(x_3) > x^*$ $x_4 = 0.872$ | $f(x_4) > x^*$ $x_5 = 0.45$ |
| Condition 3: Logic input (1, 1) $x_0 = 0.825$ | $x_1 = f(x_0 + 2\delta) < x^*$ $x_1 = 0.58$ | $f(x_1) > x^*$ $x_2 = 0.98$ | $f(x_2) < x^*$ $x_3 = 0.1$ | $f(x_3) < x^*$ $x_4 = 0.34$ | $f(x_4) > x^*$ $x_5 = 0.9$ |

So given dynamics $f(x)$, one must find values of a reference threshold $x^*$ and initial state $x_0$ satisfying the conditions derived from the truth table to be implemented. Table II shows the exact values of the initial $x_0$ and reference threshold $x^*$ when $$f(x) = 4x(1-x). \quad (1)$$

Here $x \in [0,1]$. The constant $\delta$, common to all logical gates, is fixed as 0.25. The above inequalities have many possible solutions based on the size of $\delta$. For example, by setting $\delta=0.25$, the equation for the different time shifts that each gate requires can be simulated. Thus, the inputs setup the initial state $x_0+I_1+I_2$. Then the system evolves over n iterative time steps to an updated state $x_n$. The evolved state is compared via the comparator 110 to a monitoring threshold $x^*$ (refer FIG. 1), at every n. If the state at iteration n, is greater than $x^*$ a logical 1 is the output and if the state is less than or equal to $x^*$ a logical 0 is the output. This process is repeated for subsequent iterations. Relating inputs with the obtained outputs provides the operation that is performed at a specific iteration.

Figure 2:
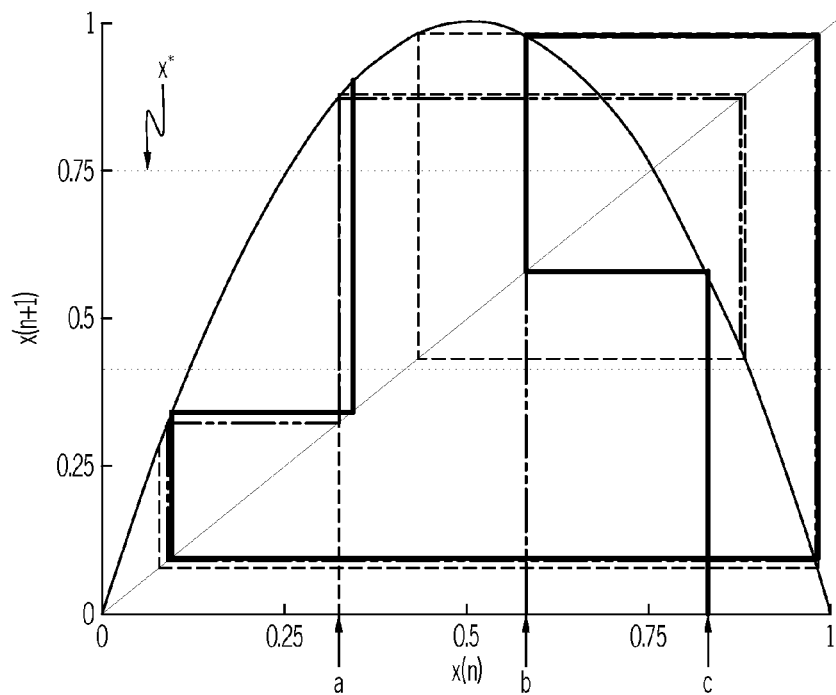
FIG. 2 is a graphical iteration representation of a logistic map according to one embodiment of the present invention.

For illustrative purposes, the graphical iteration representation of EQ. (1) for various initial values corresponding to different logic inputs is illustrated in FIG. 2. FIG. 2 is a graphical iteration representation of the logistic map with three logic initial inputs (a)=$x_0$, (b)=$x_0+\delta$ and (c)=$x_0+2\delta$ corresponding to Table II. Here $x^*=0.75$ is used to recover logic operations NAND, AND, NOR and XOR. For OR logic operation $x^*=0.4$ is utilized. The initial values are denoted by labels a, b and c. For clarity, the state of $x_n$ for first 5 iterations Implementation of Bit-by-Bit Addition The following discussion demonstrates how the ubiquitous bit-by-bit arithmetic addition, involving two logic gate outputs, can be obtained in consecutive iterations, with a single one-dimensional chaotic element as obeying EQ. (1). A simple 1-bit binary arithmetic addition requires a full adder logic, which adds three individual bits together (two bits being the digit inputs and the third bit assumed to be carry from the addition of the next least-significant bit addition operation, known as '$C_{in}$'). A typical full-adder requires two half-adder circuits and an extra OR gate. In total, the implementation of a full-adder requires five different gates (two XOR gates, two AND gates and one OR gate) (See, for example, M. M. Mano, "Computer System Architecture", 3rd Ed. Prentice Hall, Englewood Cliffs, N.J. (1993) and T. C. Bartee, "Computer Architecture and Logic Design", McGraw-Hill, New York, (1991), which are hereby incorporated by reference in their entireties).

However in one embodiment, by utilizing the dynamical evolution of a single logistic map, only two iterations of a single element are needed to implement a full-adder. Now by choosing the $\delta=0.23$ and $x_0=0.0$, the truth table, summary of the necessary and sufficient conditions to be satisfied for the full-adder operation is given in Table III. Table III is a truth table of full adder, necessary and sufficient conditions to be satisfied by the logistic map. State values $x_1$ (iteration n=1) and $x_2$ (iteration n=2) are used to obtain $C_{out}$ and S, respectively. Here

TABLE III

| Input bit for Number (A) | Input bit for Number (B) | Carry bit input ($C_{in}$) | $C_{out}$ | S | $C_{out}$ | S |
|---|---|---|---|---|---|---|
| 0 | 0 | 0 | 0 | 0 | $x_1 = f(x_0) \leq x_1^*$ | $x_2 = f(x_1) \leq x_2^*$ |
| 0 | 0 | 1 | 0 | 1 | $x_1 = f(x_0 + \delta) \leq x_1^*$ | $x_2 = f(x_1) > x_2^*$ |
| 0 | 1 | 0 | 0 | 1 | $x_1 = f(x_0 + \delta) \leq x_1^*$ | $x_2 = f(x_1) > x_2^*$ |
| 0 | 1 | 1 | 1 | 0 | $x_1 = f(x_0 + 2\delta) > x_1^*$ | $x_2 = f(x_1) \leq x_2^*$ |
| 1 | 0 | 0 | 0 | 1 | $x_1 = f(x_0 + \delta) \leq x_1^*$ | $x_2 = f(x_1) > x_2^*$ |
| 1 | 0 | 1 | 1 | 0 | $x_1 = f(x_0 + 2\delta) > x_1^*$ | $x_2 = f(x_1) \leq x_2^*$ |
| 1 | 1 | 0 | 1 | 0 | $x_1 = f(x_0 + 2\delta) > x_1^*$ | $x_2 = f(x_1) \leq x_2^*$ |
| 1 | 1 | 1 | 1 | 1 | $x_1 = f(x_0 + 3\delta) > x_1^*$ | $x_2 = f(x_1) > x_2^*$ |

$x_1^* = 0.8$, $x_2^* = 0.4$, $x_0 = 0.0$ and $\delta \approx 0.23$.

The Carry bit output $C_{out}$ and the Sumbit output S are recovered from first and second iterations of map EQ. (1), respectively. Here, thresholds $x_1^*$ and $x_2^*$ for $1^{st}$ and $2^{nd}$ iterations are fixed as 0.8 and 0.4 respectively. If $x_1 < x_1^*$ then $C_{out}$ is logic zero or else it is logic one. Also if $x_2 < x_2^*$ then S is logic zero or else it is logic one.

Now, three steps are employed to implement the full-adder logical operations:

Step 1: Initialization of the state of the system to $x_0$ and addition of external inputs, $$x \rightarrow x_0 + I_1 + I_2 + I_3$$

where $x_0$ is the initial state of the system, and I=0 when logic input is zero, and I=$\delta$ (where $\delta$ is some positive constant) when logic input is one. Here, $I_1$, $I_2$ and $I_3$ correspond the input number A, input number B and carry input $C_{in}$ respectively of Table III. So the following four situations are to be considered:

Case 1. If all inputs are 0 (row 1 in Table III) i.e., the initial state of the system is $$x_0 + 0 + 0 + 0 = x_0$$

Case 2. If any one of the input equals 1 (row 2, 3 and 5 in Table III) i.e., the initial state is $$x_0 + 0 + 0 + \delta = x_0 + 0 + \delta + 0 = x_0 + \delta + 0 + 0 = x_0 + \delta$$

Case 3. If any two inputs equal to 1 (row 4, 6 and 7 in Table III), i.e., the initial state is $$x_0 + 0 + \delta + \delta = x_0 + \delta + 0 + \delta = x_0 + \delta + \delta + 0 = x_0 + 2\delta.$$

Case 4. If all inputs equal to 1 (row 8 in Table III), i.e., the initial state is $$x_0 + \delta + \delta + \delta = x_0 + 3\delta.$$

Step 2: Chaotic evolution for two time steps, of the initial state given above, via Eq. (1).

Step 3: The evolved state $f_n(x)$ yields the logic output as follows:

Logic Output=0 if $f_n(x) \leq x_n^*$,
Logic Output=1 if $f_n(x) > x_n^*$,
where $x_n^*$ is a monitoring threshold, with n=1, 2.

In this representative example of implementing full adder operation, applying step 3 to the first two iterative values (n=1 and 2) of Eq. (1), i.e., $f(x_0)=x_1$ and $f(x_1)=x_2$ yield the two outputs encoding $C_{out}$ and S in Table III. So basically an element takes the three inputs A, B and $C_{in}$ and produces the carry for the next addition on the very first update. This new carry can of course be immediately supplied to the next element ready to perform the addition of the next bits, while the current sum (S) is calculated on the second update. However, it should be emphasized that the time delay of occurrence between $C_{out}$ and S (through iteration delay) can be compensated by adapting an interface circuitry (in actual hardware implementation) like sample-and-hold circuits with suitable sampling pulses (See, for example, K. Murali, A. Miliotis, W. L. Ditto, S. Sinha, M. L. Spano, (Preprint, Unpublished) 2009 which is hereby incorporated by reference in its entirety.) As a final note, consider that the map can be allowed to evolve beyond the second iteration (n>2) just as was done for the two input case discussed above and obtain different logical operations.

Implementation of Multi-Input Logic Gates

As in the section entitled "Generation Of A Sequence Of Logic Operations Using Iterates Of A Chaotic Map", consider a single chaotic element to be the logistic map model described by EQ. (1). Now this basic element can be further used to do specific logical operations with three or more logical inputs. The basic modification simply involves adding another input to the conventional 2-input logic gate structure. Three or more input logic gates are advantageous because they require less complexity in actual experimental circuit realization than that of coupling conventional 2-input logic gates (See, for example, M. M. Mano, "Computer System Architecture", $3^{rd}$ Ed. Prentice Hall, Englewood Cliffs, N.J. (1993); T. C. Bartee, "Computer Architecture and Logic Design", McGraw-Hill, New York, (1991)).

The weights ($\delta$) given to each logic input are considered to be the same for the 2-input and 3-input gates, but the reference threshold value x* will be different. In a manner exactly like the 2-input gates above, appropriate choices of $x_0$ and x* can be found that lead to the realization of the 3-input XOR and XNOR logic operations. The truth table for 3-input XOR and XNOR logic gate operations, the necessary and sufficient conditions to be satisfied by the map is shown in Table IV. Table IV is a truth table of the 3-input XOR and XNOR logic operations, necessary and sufficient conditions to be satisfied by the map. State value $x_2$ (iteration n=2) is used for logic operation recovery. Here x*=0.5 and $\delta \approx 0.25$.

TABLE IV

| $I_1$ | $I_2$ | $I_3$ | XOR | XNOR | XOR ($x_0 = 0$) | XNOR ($x_0 = 0.25$) |
|---|---|---|---|---|---|---|
| 0 | 0 | 0 | 0 | 1 | $x_2 \leq x^*$ | $x_2 > x^*$ |
| 0 | 0 | 1 | 1 | 0 | $x_2 > x^*$ | $x_2 \leq x^*$ |
| 0 | 1 | 0 | 1 | 0 | $x_2 > x^*$ | $x_2 \leq x^*$ |
| 1 | 0 | 0 | 1 | 0 | $x_2 > x^*$ | $x_2 \leq x^*$ |
| 0 | 1 | 1 | 0 | 1 | $x_2 \leq x^*$ | $x_2 > x^*$ |
| 1 | 0 | 1 | 0 | 1 | $x_2 \leq x^*$ | $x_2 > x^*$ |
| 1 | 1 | 0 | 0 | 1 | $x_2 \leq x^*$ | $x_2 > x^*$ |
| 1 | 1 | 1 | 1 | 0 | $x_2 > x^*$ | $x_2 \leq x^*$ |

In this representative case, the state value $x_2$ (i.e., at iteration n=2) of the logistic map is used uniformly for logic recovery. The threshold value x* and $\delta$ are fixed as 0.5 and 0.25 respectively. For morphing between XOR and XNOR logic operations, the initial values are fixed as $x_0=0$ and $x_0=0.25$ respectively.

Experimental Realization

Figure 3:
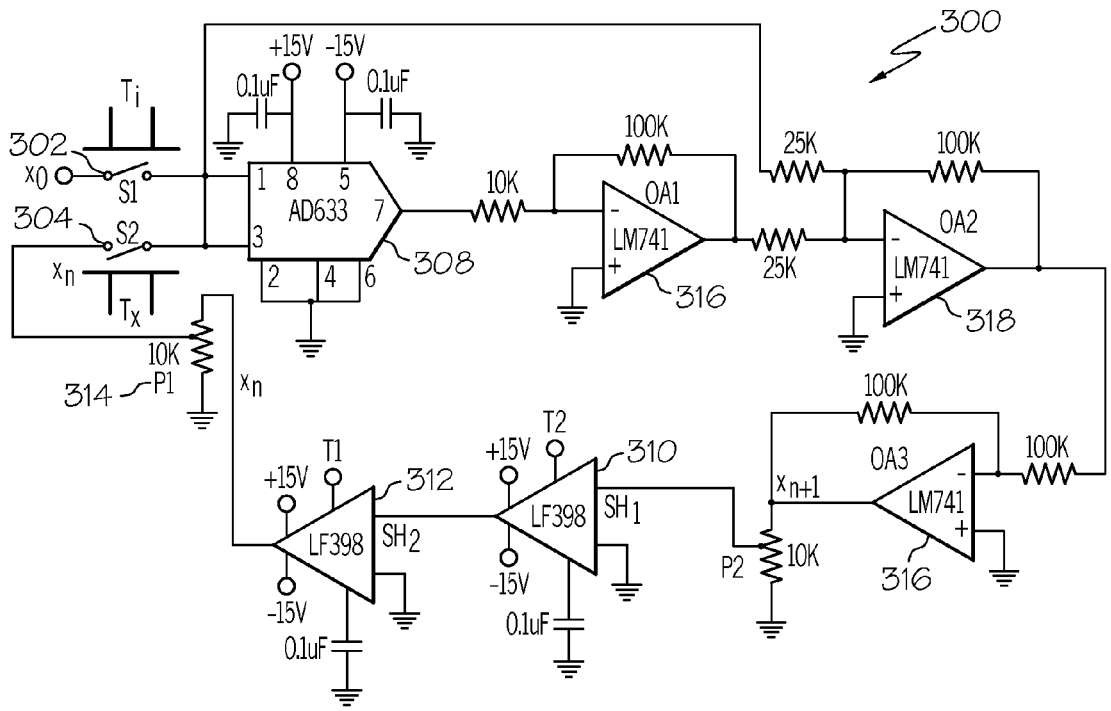
FIG. 3 is a circuit schematic of the logistic map of FIG. 1 according to one embodiment of the present invention.

An experimental realization of the theory discussed above is now presented. There are two possible ways in which simple experimental circuit realizations of FIG. 1 can be achieved, as discussed below. The first example is an experimental circuit module for logic through successive iterations and full-adder results. Consider a single chaotic map of EQ. (1) and extract logic behavior with successive iterations by using suitable sample-and-hold circuitry. The schematic circuit diagram for the realization of logic through successive iterations of EQ. (1) is shown in FIG. 3. In FIG. 3 the timing pulses T1 and T2 are generated from the clock generator providing a delay of feedback. The iteration speed is controlled by the period these pulses. The output voltage of operational amplifier OA3 306 becomes a new input to the multiplier AD633 308 after passing through two sample-and-hold circuits. The sample-and-hold circuits SH1 310 and SH2 312 are constructed, in this example, with LF398 or ADG412 ICs and they are triggered by pulses T1 and T2. Pulses $T_i$ and $T_x$ control the logic input initialization.

In this circuit 300, all the inputs and outputs are considered in-terms of voltage. Here the logic level input $I=I_1+I_2$ is added to $x_0$ and used as the new input to the logistic map iteration to generate $x_{n+1}$. Thus depending upon the level of I, $x_0$ assumes $x_0$ or $x_0+\delta$ or $x_0+2\delta$. This input is applied whenever the pulse $T_i$ goes high (switch S1 302 is ON and switch S2 304 is OFF). When pulse-train $T_i$ goes low, then the pulse $T_x$ goes high (switch S2 304 is ON and switch S1 302 is OFF) and new $x_n$ value is further iterated by the logistic map circuit to generate $x_{n+1}$. The number of iterations is fixed by the period of either $T_i$ or $T_x$ (as they are complementary waveforms). Usually the period of $T_i$ or $T_x$ considered as integer multiples of periods of iteration control signal T1 or T2. By using a threshold reference signal x*, the signal difference between $x_n$ and x* is monitored for a particular iteration and the corresponding logic level is generated through a comparator circuit 400 as shown in FIG. 4.

Figure 4:
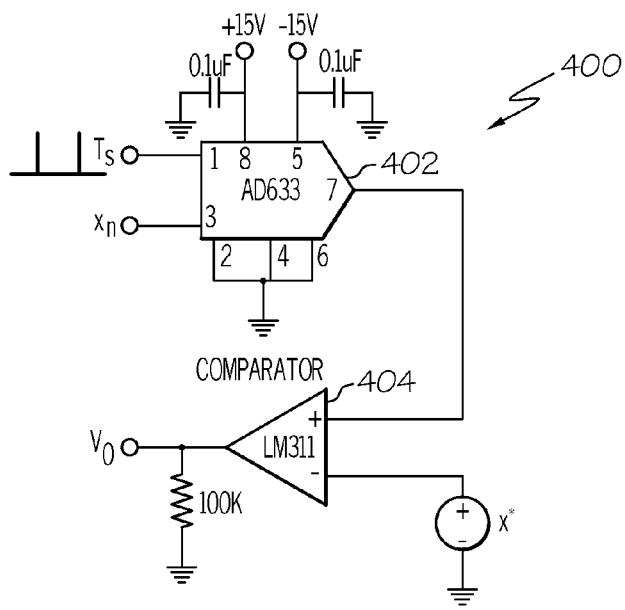
FIG. 4 is a circuit schematic for logic recovery based on the circuit of FIG. 3 according to one embodiment of the present invention.

In particular, FIG. 4 shows a circuit implementation for logic recovery form the circuit 300 of FIG. 3. The iteration output $x_n$ is multiplied by a sampling signal $T_s$ by a multiplier 402. The period of $T_s$ is same as the period of pulse $T_i$. A delay in occurrence of pulse $T_s$ controls the type of logic response needed. The output from the multiplier is level compared with signal x* and the recovered logic $V_0$ is measured across the output of a comparator 404.

In FIG. 3, the circuit realization of the chaotic logistic map is depicted. In the circuit implementation $x_{n-1}$, $x_n$ and $x_{n+1}$ denote voltages normalized by 10V as the unit. An analog multiplier IC AD633 308 is used as a squarer and it produces the output voltage of $x_n^2/10V$ for the given $x_n$ as the input. By using suitable scale changer, summing amplifier and an inverter, the voltage proportional to $x_{n+1}$ is available at the output of op-amp (OA3) circuit 306. A variable resistor P1 314 is employed to control the parameter from 0 to 1 in the logistic map. The output voltage of OA3 306 becomes a new input voltage to the multiplier AD633 after passing through two sample-and-hold circuits (SH1 310 and SH2 312).

The sample-and-hold circuits 310, 312 are constructed, in this example, with IC LF398 or ADG412 and they are triggered by suitable delayed timing pulses T1 and T2. The timing pulses are usually generated from the clock generator providing a delay of feedback and the delay is essential for obtaining the solution $x_{n+1}$ of the logistic map. Usually the clock rate of either 5 KHz or 10 KHz is used for the generation of T1 and T2. This clock rate fixes the iteration speed of the chaotic logistic map circuit. Op-amps OA1-OA3 306, 316, 318 are implemented, in this example, with µA741 or AD712 ICs.

FIGS. 5-13 show the timing sequences generated by using the circuits of FIGS. 3-4 for NAND, AND, NOR, XOR and OR logic responses. Timing sequences of different logic gates are obtained by a sampling the waveform $x_n$ for different iterations. A multiplier circuit is employed to generate the sampled signal from $x_n$ with suitable sampling pulse signal $T_s$. Proper time-delay is introduced in the sampling pulse sequence $T_s$ to acquire appropriate logic. In the present example, the first 5 iterations (n=1, 2, 3, 4, 5) are used to generate NAND, AND, NOR, XOR and OR logic responses respectively. A delay of 0.1 ms is used in sampling pulse sequence $T_s$ to get NAND gate response. Further delay values like 0.41 ms, 0.82 ms, 1.22 ms and 1.63 ms are used to generate sampled waveforms for the observation of AND, NOR, XOR and OR logic responses respectively. After $5^{th}$ iteration, the input $x_0$ is reset by new value by pulse $T_i$. Then the iterations repeat. The sampled waveform being generated by the circuit of FIG. 4 via a multiplier is passed further through a comparator circuit. Here the sampled waveform is compared with the signal x*=0.65V to generate appropriate logic levels. The circuit results are tested with both PSPICE circuit simulations and through hardware implementations.

Figure 5:
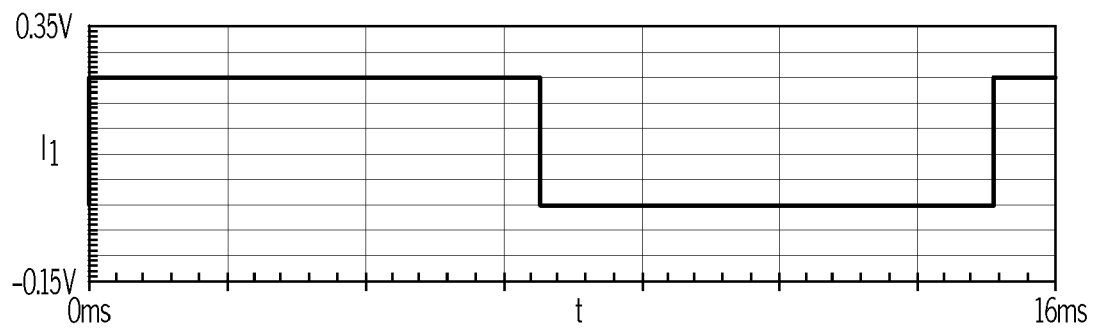
FIGS. 5-8 show the timing sequences of different logic gates implemented by the circuit shown in FIG. 3 according to one embodiment of the present invention.
Figure 6:
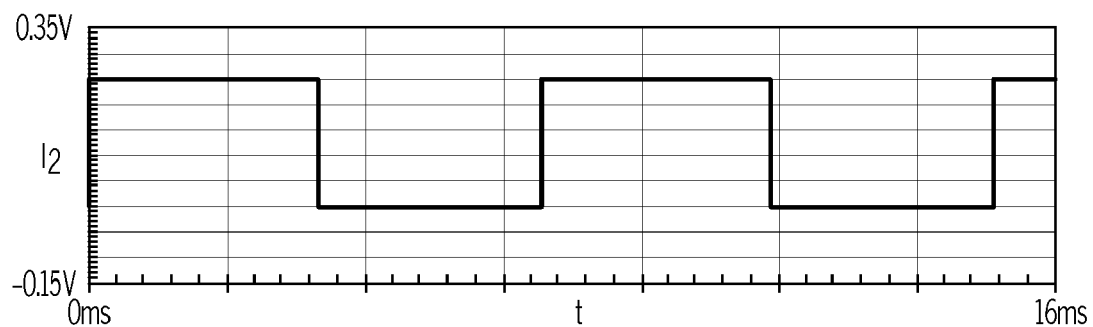
Figure 7:
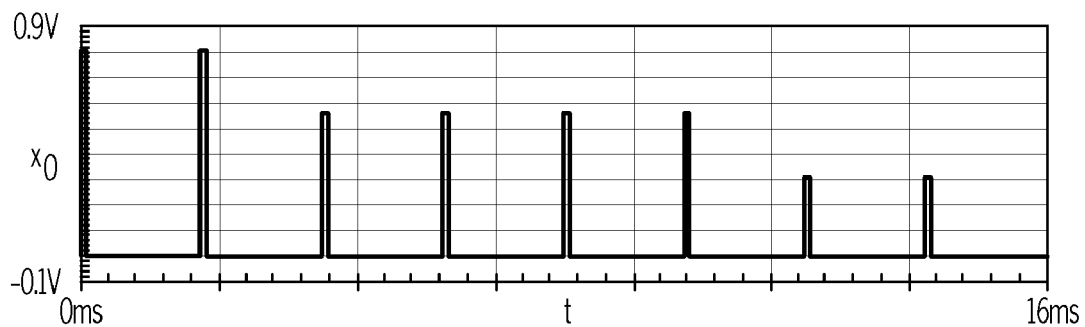
Figure 8:
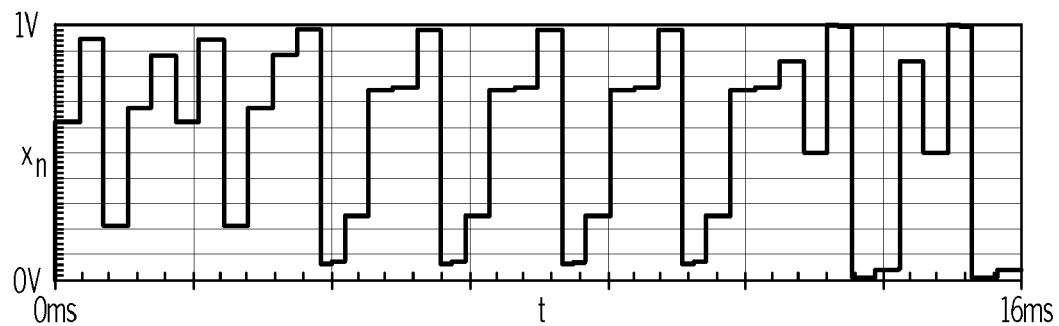
Figure 9:
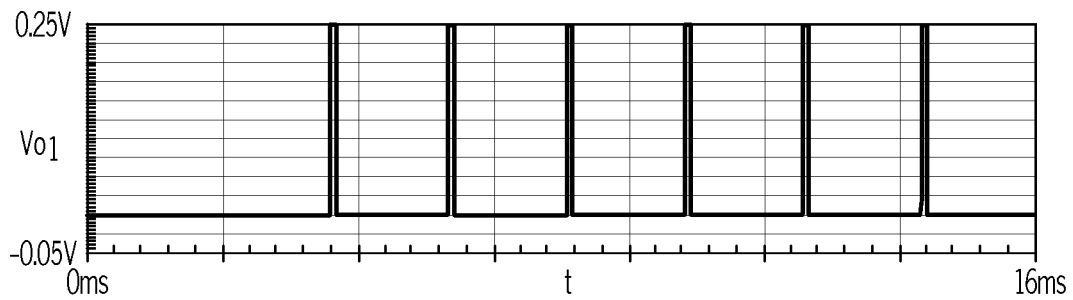
FIGS. 9-13 show the timing sequences of different logic gates sampled by using the waveform $x_n$ for different iterations according to one embodiment of the present invention.
Figure 10:
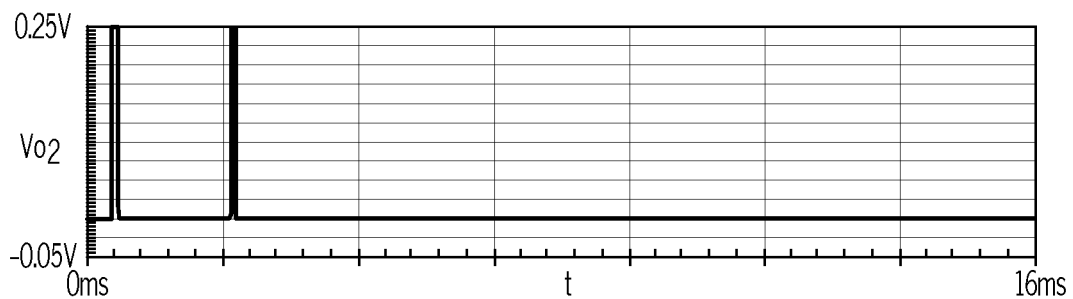
Figure 11:
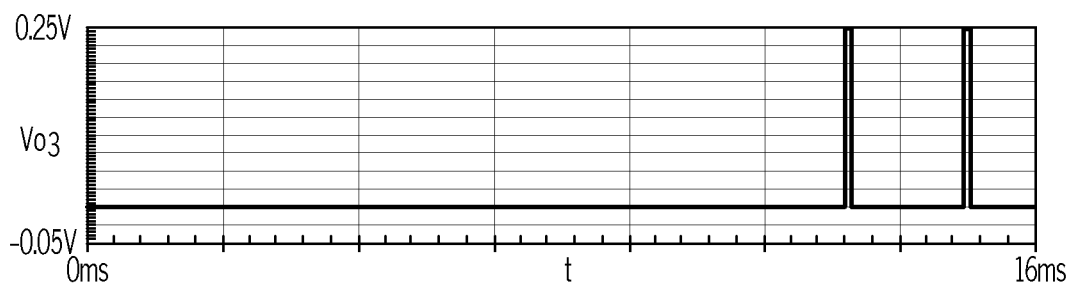
Figure 12:
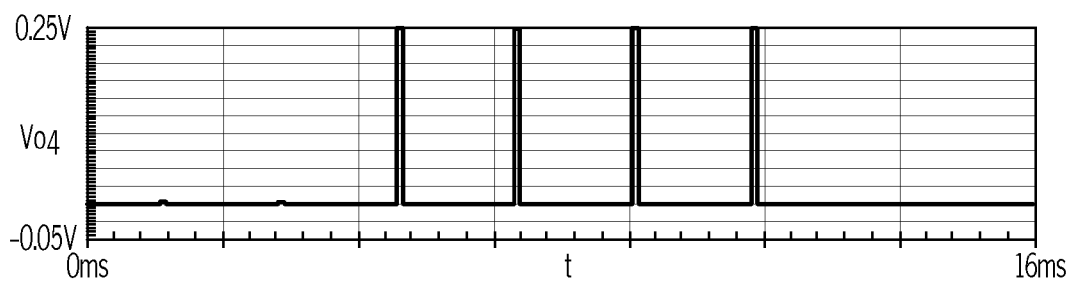
Figure 13:
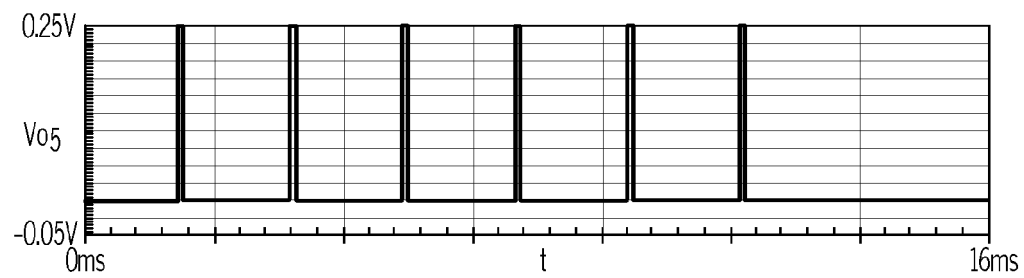

In particular, FIGS. 5-8 show the timing sequences of different logic gates implemented by the circuit 300 in FIG. 3. FIG. 5 is the time sequence for the first input $I_1$. FIG. 6 is the timing sequence for the second input $I_2$. FIG. 7 is the timing sequence for the initial value $x_0$. FIG. 8 is the timing sequence for the iterative sequences $x_n$. Note for every 5 iterations (n=5), the iterative sequences are re-setted by pulse $x_0$. FIGS. 9-13 are the timing sequences of different logic gates sampled by using the waveform $x_n$ for different iterations. The threshold reference signal x*=0.65V. The voltages are measured across the output of the comparator 404. FIG. 9 shows the timing sequence for a NAND gate response for n=1. FIG. 10 shows the timing sequence for an AND gate response for n=2. FIG. 12 shows the timing sequence for a NOR gate response for n=3(panel 3). FIG. 13 shows the timing sequence for a XOR gate response for n=4(panel 4) and OR gate response for n=5(panel 5). The time-shifts for various logic responses are due to sampling timing pulse delay.

One of the applications of the logic realization using the iterative map as discussed before can be illustrated by an example. Next, it is shown how one can obtain the ubiquitous bit-by-bit arithmetic addition in consecutive iterations of a single one-dimensional chaotic element as represented by EQ. (1). Typically full-adder requires three logic inputs, two half-adder circuits and an OR gate. The two outputs from the full adder are usually Carry and Sum. In total, the implementation of a full-adder requires five different conventional digital logic elements. However, using the dynamical evolution of a single logistic map, only two iterations are required to implement the full-adder circuit, satisfying its corresponding truth-table.

Figure 14:
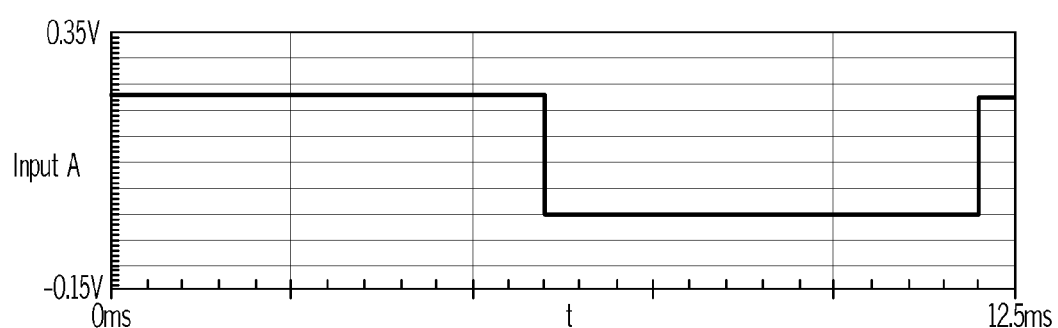
FIGS. 14-20 show the timing sequences for a full adder according to one embodiment of the present invention.
Figure 15:
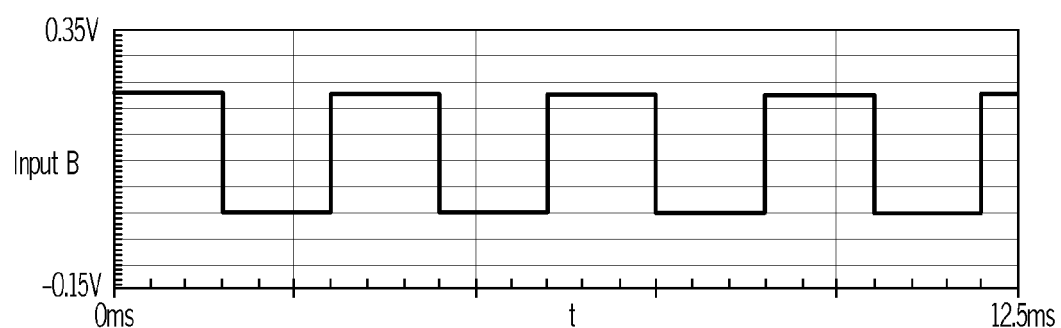
Figure 16:
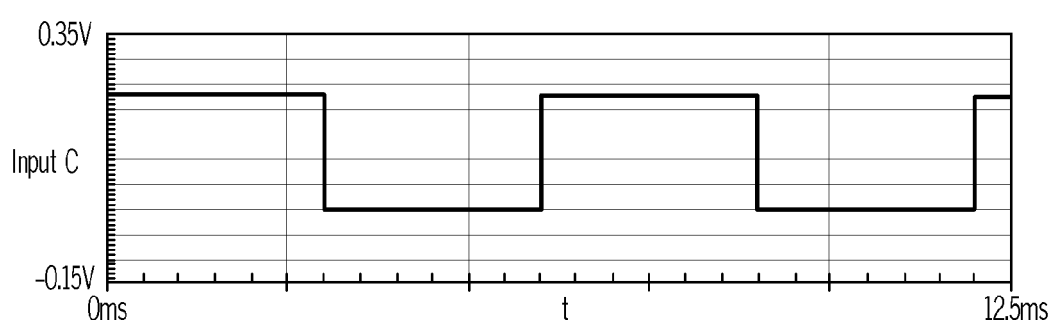
Figure 17:
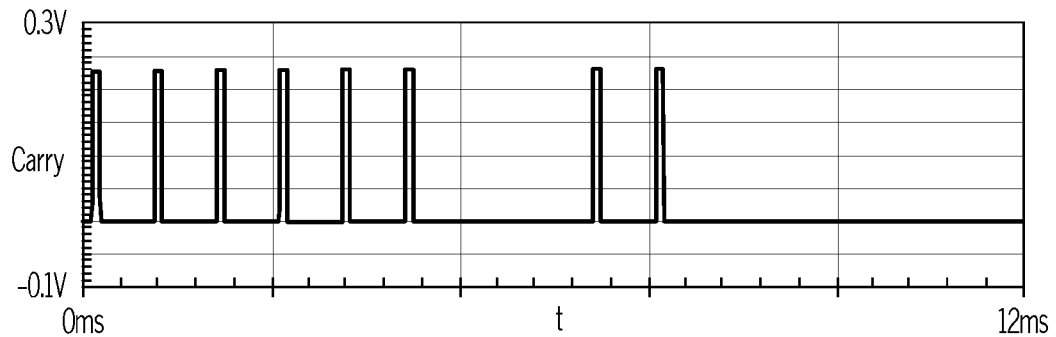
Figure 18:
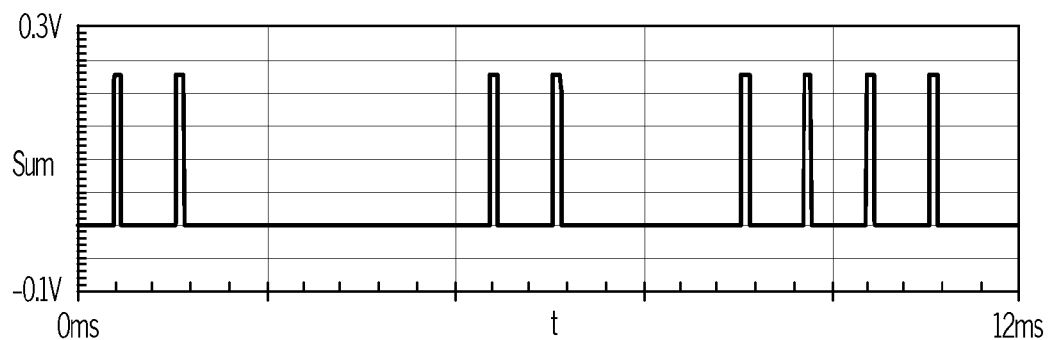
Figure 19:
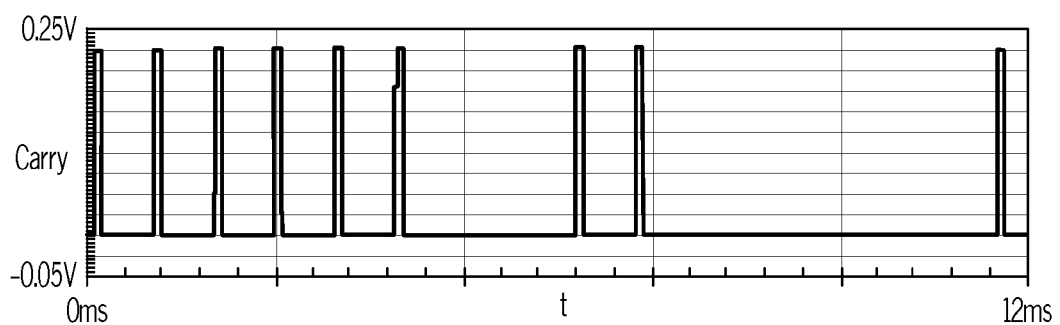
Figure 20:
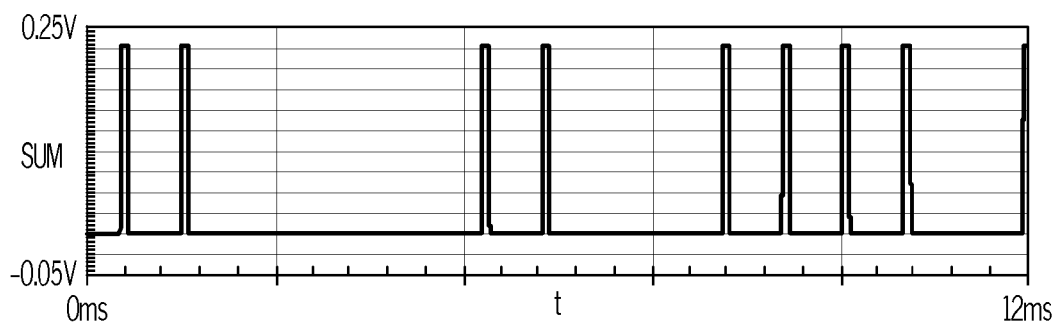

The full-adder operation truth table is shown in Table III above. Now by choosing the $\delta=0.23V$ and $x_0=0V$, the Carry bit output $C_{out}$ and the Sum-bit output S are recovered from first and second iterations of map EQ. (1) respectively. Here thresholds $x_1^*$ and $x_2^*$ are fixed as 0.8V and 0.4V respectively. If $x_1 \leq x_1^*$ then $C_{out}$ is logic zero or else it is logic one. Also if $x_2 \leq x_2^*$ then S is logic zero or else it is logic one. Representative timing waveforms for the full-adder implementation are depicted in FIGS. 14-20. In particular, FIG. 14 shows the timing sequence for a first input A. FIG. 15 shows the timing sequence for a Second input B. FIG. 16 shows the timing sequence for a third input $C_{in}$ and iteration waveform $x_n$. FIG. 17 shows the timing sequence for and initial value $x_0$. FIG. 18 shows the timing sequence for an iteration waveform $x_n$. FIG. 19 shows a timing sequence for a carry-out waveform that is generated from $x_1$ for $x_1^*=0.8V$. FIG. 20 shows a timing sequence for a sum waveform that is generated from $x_2$ for $x_2^*=0.4V$. It should be noted that inputs A, B, and C are mapped to $x_0$ of FIG. 1. The CARRY and SUM outputs are obtained from $x_n$ using the circuits 300, 400 of FIGS. 3-4.

Figure 21:
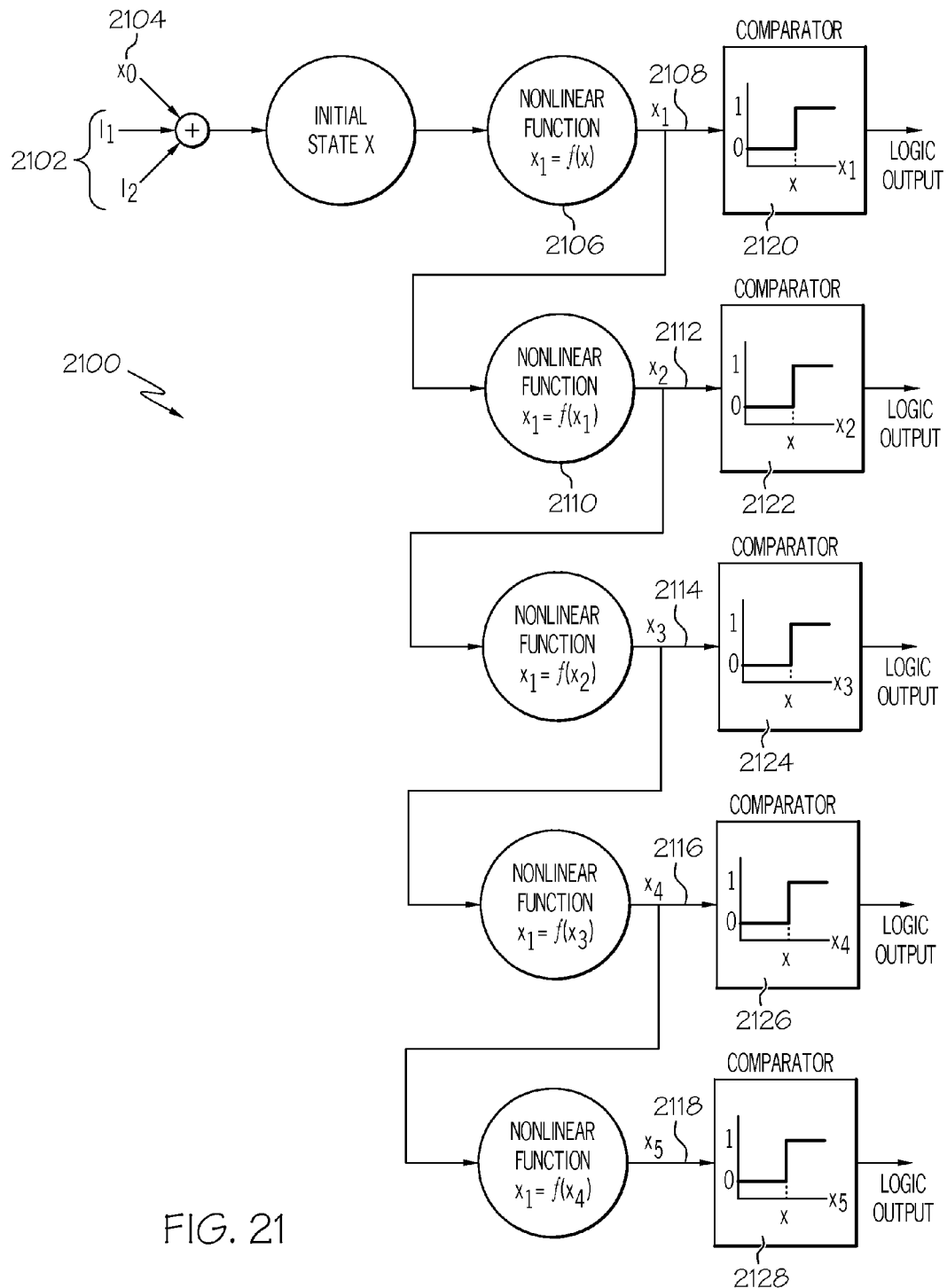
FIG. 21 is a schematic diagram of a system comprising sequentially connected nonlinear maps based logic operations according to one embodiment of the present invention.

Another experimental realization will now be discussed. In particular, an experimental circuit module for logic through sequentially connected nonlinear maps and full adder results is discussed in detail. In this embodiment, the iterations of the chaotic map of EQ. (1) are considered as the repetitive application of the nonlinear map sequentially. This is considered as the configuration of multiple sequentially connected nonlinear maps with unidirectional coupling (through state variables). The output of each nonlinear map or block is suitably extracted to reveal logic output. The schematic diagram for this approach is shown in FIG. 21, which shows a system 2100 of sequentially connected nonlinear maps based logic operations. In this system 2100, the logic output is recovered from $x_n$ using a comparator with reference threshold value x.

Here the logic level input 2102 $I=I_1+I_2$ is added to $x_0$ 2104 and used as the new input to the nonlinear map 2106 to generate updated value $x_1$ 2108. Then this updated value $x_1$ 2108 is then fed to the nonlinear map 2110 sequentially to generate the new updated value $x_2$ 2112. This process is continues to generate $x_3$ 2114, $x_4$ 2116, $x_5$ 2118, etc. The desired logic outputs are extracted from $x_1$, $x_2$, $x_3$, $x_4$ and $x_5$ individually using separate comparator action 2120-2128 by comparing the state values with reference threshold $x^*$.

Figure 22A:
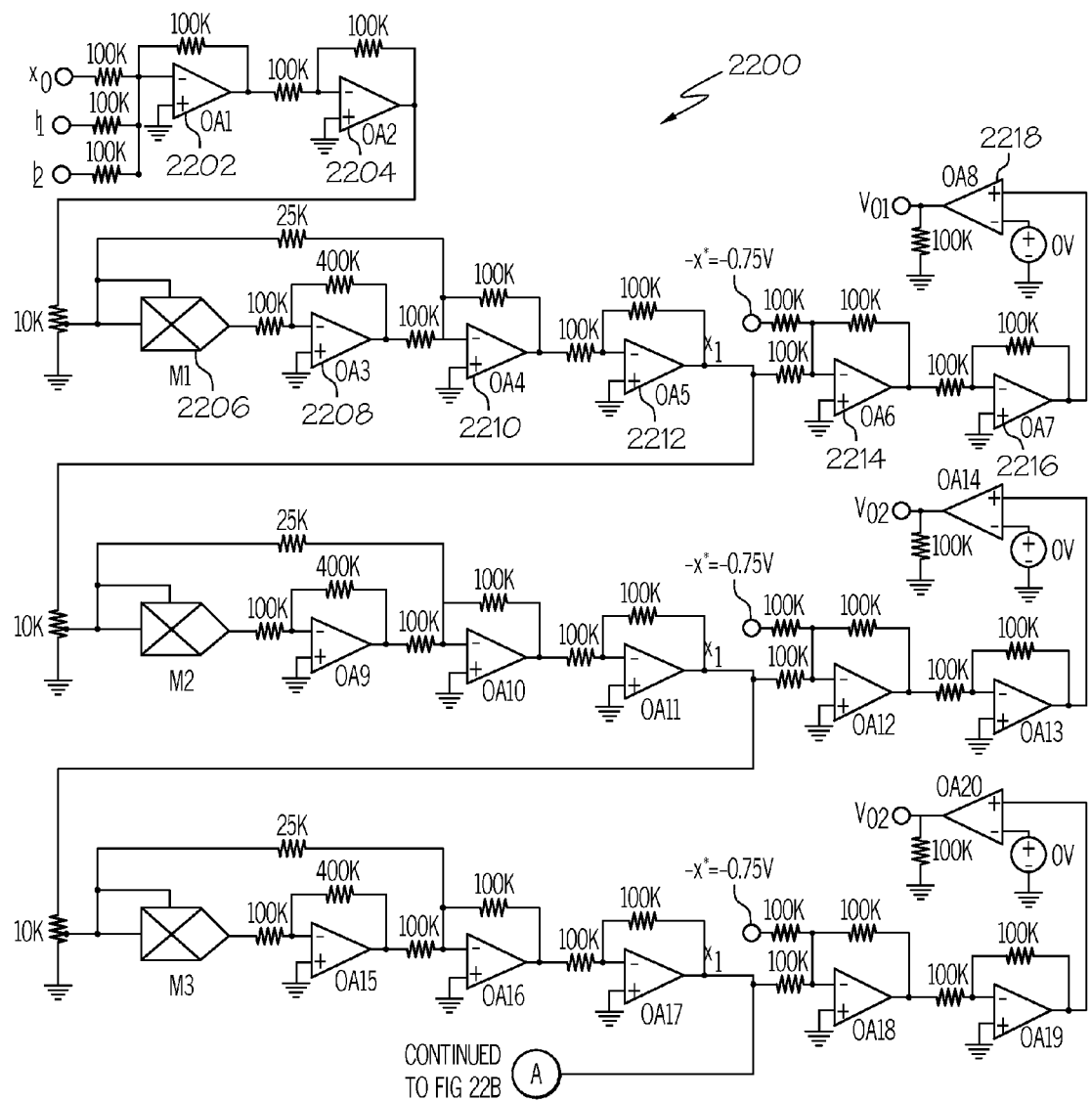
FIG. 22 is a circuit schematic for the system of FIG. 21 according to one embodiment of the present invention.
Figure 22B:
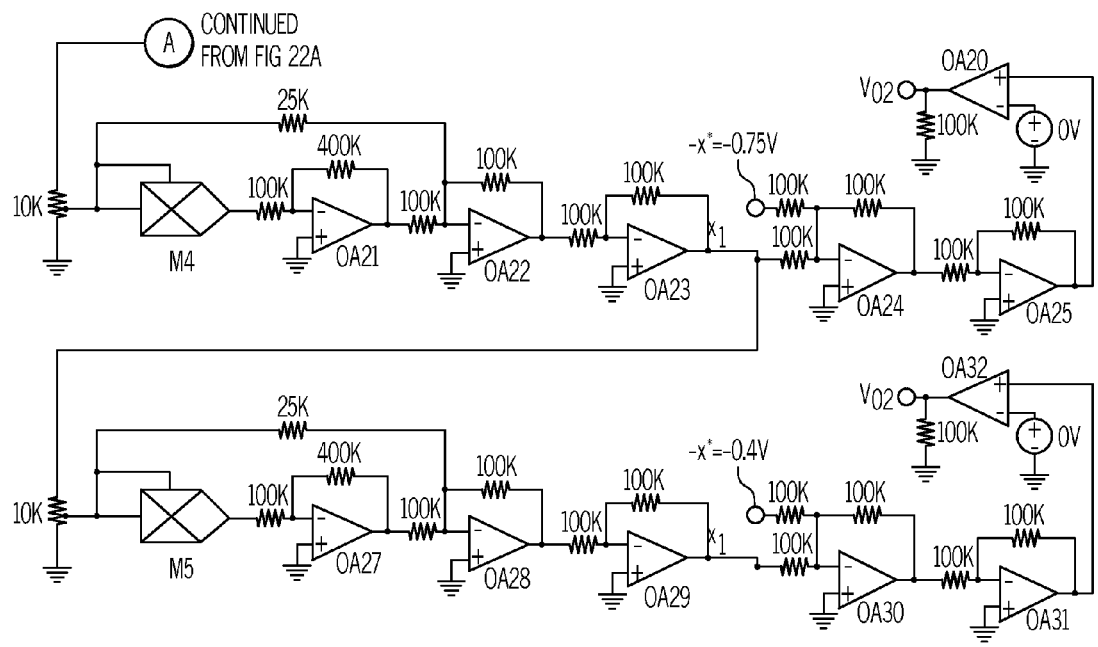

FIG. 22 shows the circuit realization of the system 2100 in FIG. 21. In FIG. 22, the output voltages $VO_1$ to $VO_5$ represent the logic NAND, AND, NOR, XOR and OR respectively. These voltages are generated from the state values $x_1$ to $x_5$ respectively. Circuitry comprising op-amps $OA_1$ 2202 and $OA_2$ 2204 forms an input summing amplifier section to generate the signal $x_0+I_1+I_2$. The circuitry comprising analogue multiplier $M_1$ 2206 and op-amps $OA_3$ to $OA_5$ 2208-2212 forms the simulation of the nonlinear map to generated the updated value $x_1$. The circuitry comprising op-amps $OA_6$ to $OA_8$ 2214-2218 forms the comparator action to generate the recovered logic output $VO_1$. Here $x^*$ is the threshold reference voltage signal used for logic recovery. The resistor values are used as indicated in the circuit. The rest of the circuit 2200 comprises subsequent copies of nonlinear map and comparator sections to generate the recovered logic outputs $VO_2$ to $VO_5$. The logic 1 (High) is represented as $\delta=0.25V$ and logic 0 (Low) is represented as $\delta 0V$.

In the circuit 2200, the state values $x_1$, $x_2$, $x_3$, $x_4$, $x_5$, the threshold reference value $x^*$, the initial condition $x_0$, the logic level inputs $I_1$, $I_2$ and the recovered logic outputs are denoted in terms of voltages. The analogue multiplier 2206 is used as a squarer for the given $x_n$ as the input. The logic input voltage $I=0, 0.25$ or $0.5V$ corresponding to different logic levels. Here $x^*$ is another reference threshold voltage being used to produce the difference voltage from the state variable $x_n$. Here the op-amps OA1 to OA32 are implemented, in this example, with µA741 or AD712. The various resistor values are shown in FIG. 22.

Figure 23:
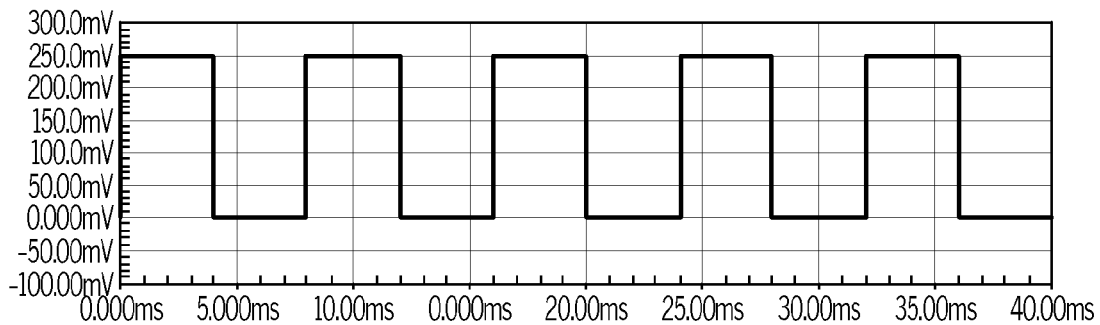
FIGS. 23-34 show the timing sequences for different logic gates implemented by the circuit of FIG. 24 according to one embodiment of the present invention.
Figure 24:
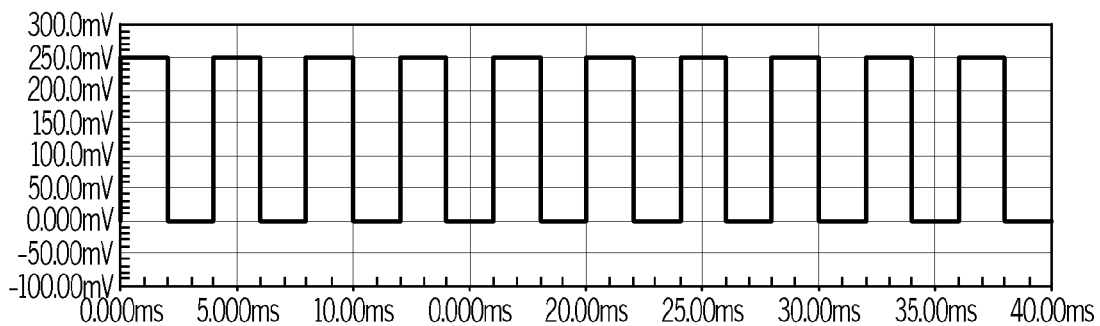
Figure 25:
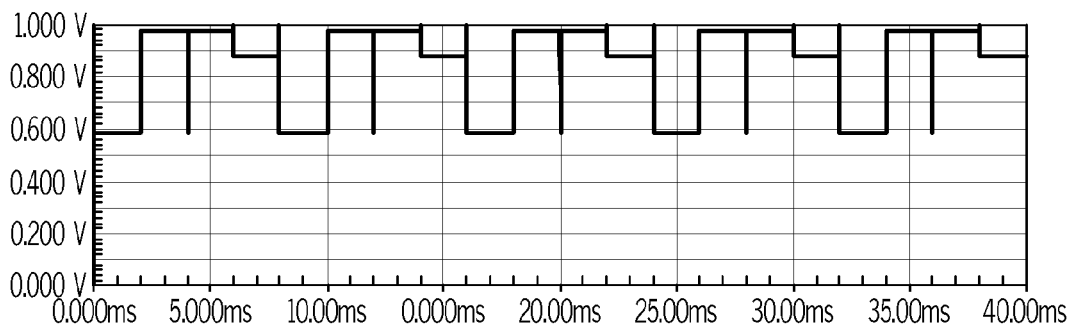
Figure 26:
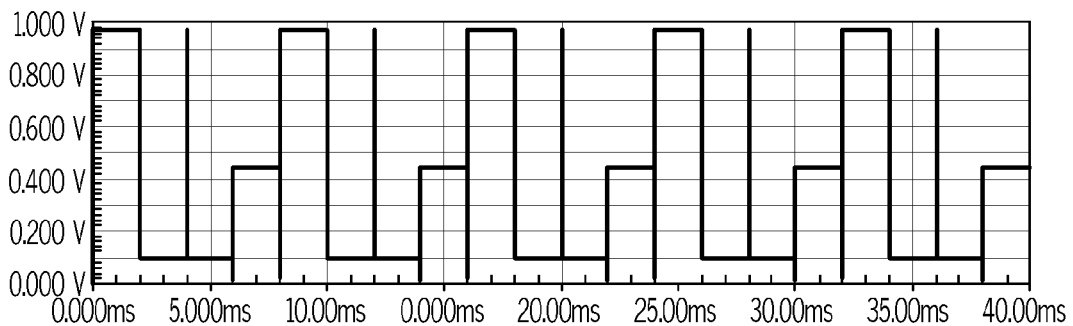
Figure 27:
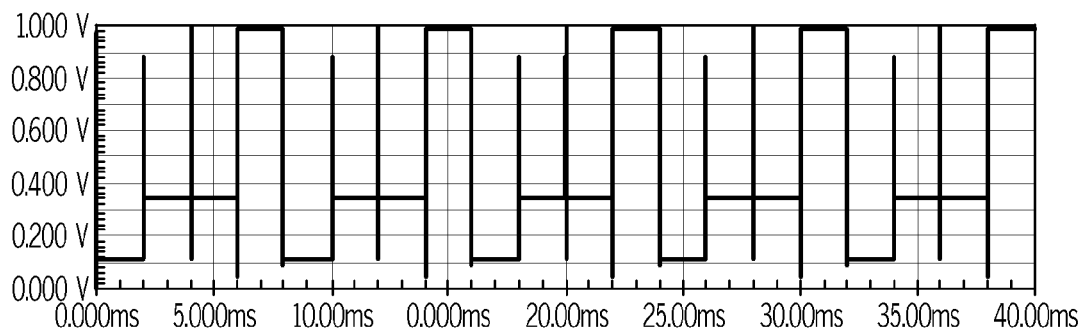
Figure 28:
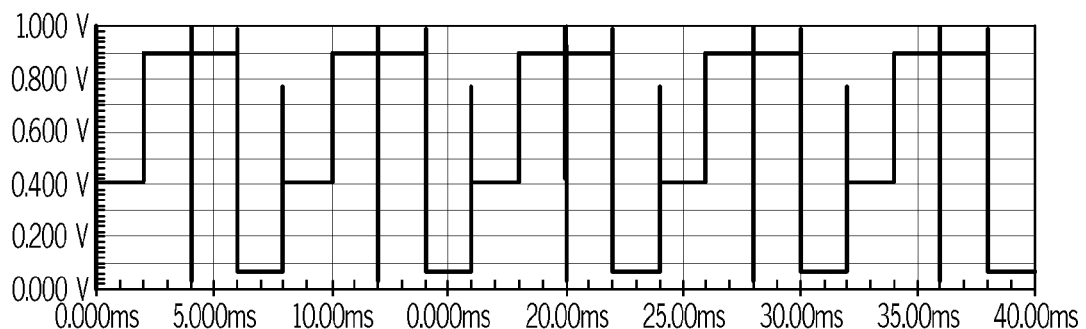
Figure 29:
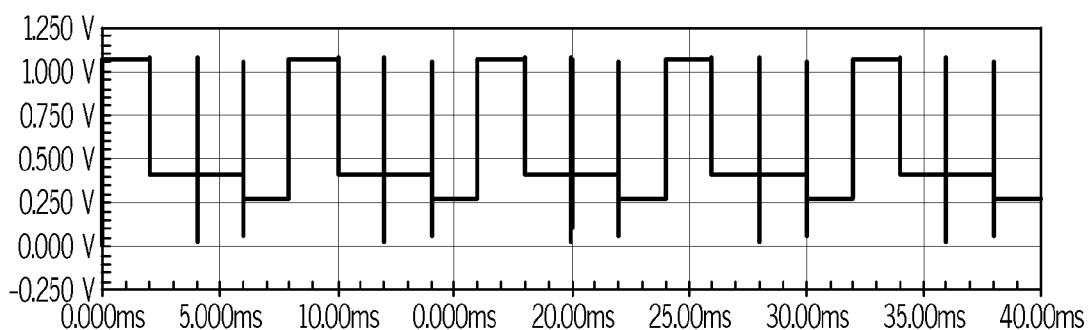
Figure 30:
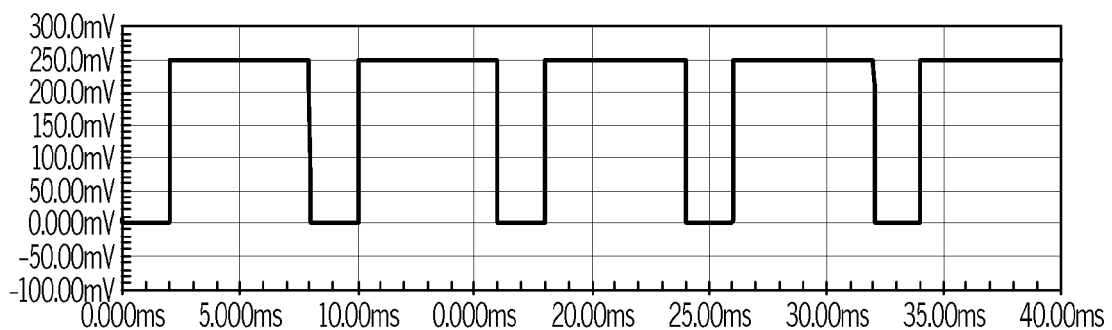
Figure 31:
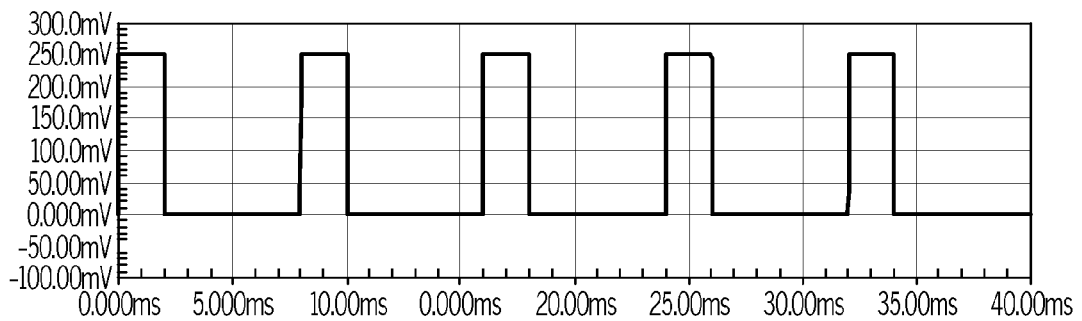
Figure 32:
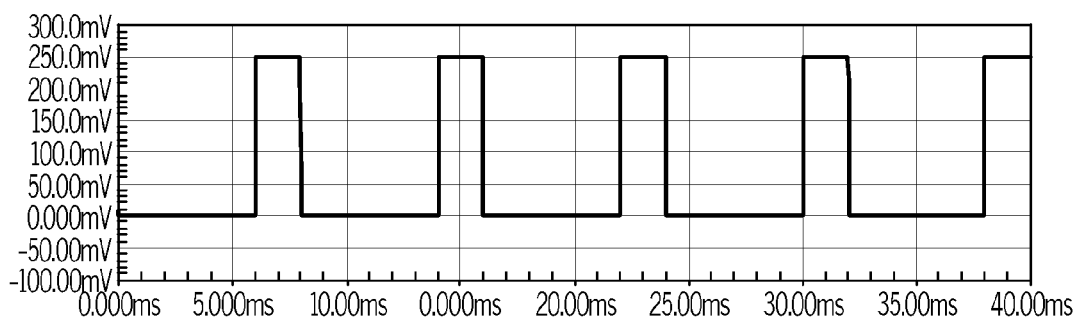
Figure 33:
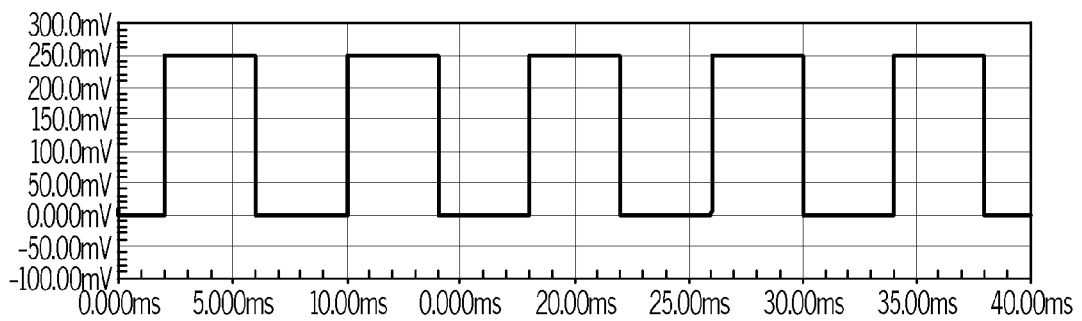
Figure 34:
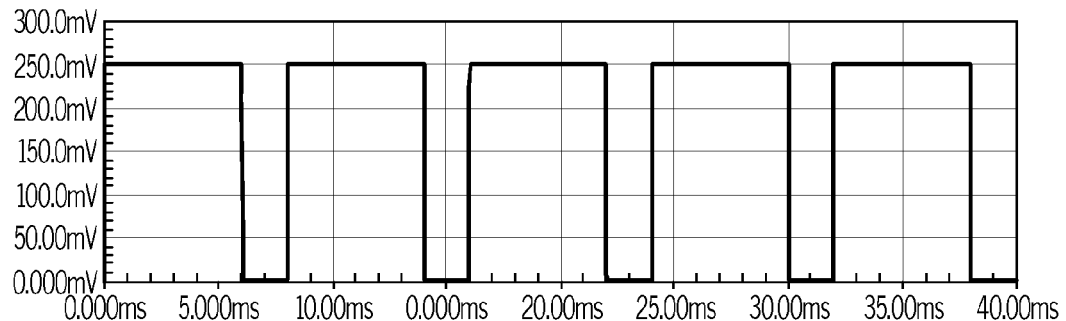

FIGS. 23-34 show the timing sequences of the implementation of five representative gates implemented by the circuit 2200 of FIG. 22. The output waveforms are generated with both PSPICE circuit simulations and also through hardware implementations. In particular, FIGS. 23-26 shows the timing sequence of different logic gates implemented by the circuit 2200 in FIG. 22 for $x_0=0.325V$. FIG. 23 shows the timing sequence for a first input $I_1$. FIG. 24 shows the timing sequence for a second input $I_2$. FIG. 25 shows the timing sequence for a, updated state value $x_1$. FIG. 26 shows the timing sequence for an updated state value $x_2$. FIGS. 27-30 show timing sequences of different logic gates implemented by the circuit 2200 in FIG. 22 for $x_0=0.325V$. FIG. 27 shows the timing sequence for an: updated state value $x_3$. FIG. 28 shows the timing sequence for an updated state value $x_4$. FIG. 29 shows the timing sequence for an updated state value $x_5$. FIG. 30 shows the timing sequence for a recovered NAND logic output $VO_1$ with $x^*=0.75V$. FIGS. 31-34 show timing sequences of different logic gates implemented by the circuit 2200 in FIG. 22 for $x_0=0.325V$. FIG. 31 shows the timing sequence for a recovered AND logic output $VO_2$ (panel 1) with $x^*=0.75V$. FIG. 32 shows the timing sequence for a recovered NOR logic output $VO_3$ with $x^*=0.75V$. FIG. 33 shows the timing sequence for a recovered XOR logic output $VO_4$ with $x^*=0.75V$. FIG. 34 shows the timing sequence for a and recovered OR logic output $VO_5$ with $x^*=0.4V$.

Figure 35:
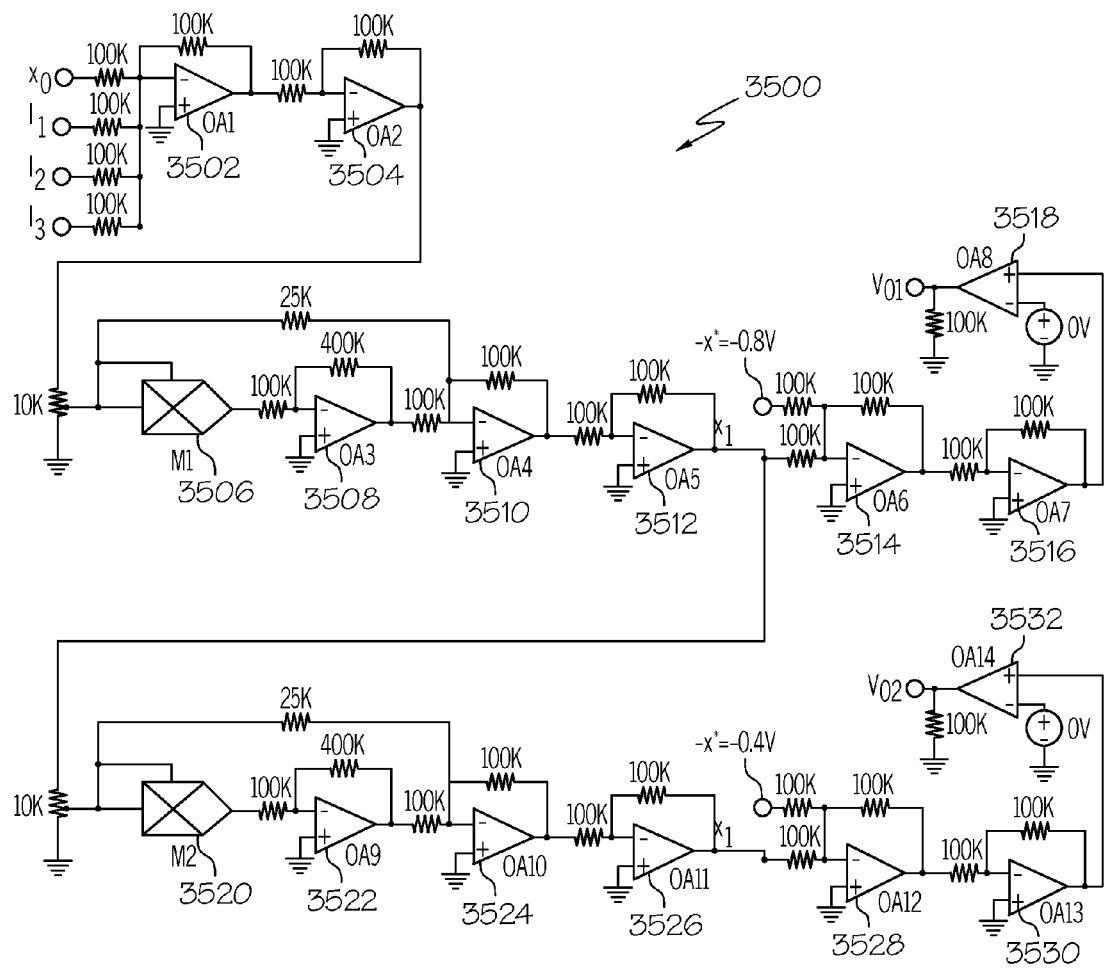
FIG. 35 is a circuit schematic for a full adder according to one embodiment of the present invention.

FIG. 35 shows the schematic of a circuit 3500 implementing the full-adder discussed above with $x_0=0V$ and $\delta=0.23V$. The output voltages $VO_1$ and $VO_2$ represent the logic CARRY and SUM respectively. These voltages are generated from the state values $x_1$ and $x_2$ respectively. Circuitry comprising op-amps $OA_1$ 3502 and $OA_2$ 3504 forms an input summing amplifier section to generate the signal $x_0+I_1+I_2+I_3$. The circuitry comprising an analogue multiplier $M_1$ 3506 and op-amps $OA_3$ to $OA_5$ 3508-3512 forms the simulation of the nonlinear map to generate the updated value $x_1$. The circuitry comprising op-amps $OA_6$ to $OA_8$ 3514-3518 forms the comparator action to generate the recovered logic output $VO_1$. Here $x_1^*=0.8V$ is the threshold reference voltage signal used for CARRY recovery.

The circuitry comprising analogue multiplier $M_2$ 3520 and op-amps $OA_9$ to $OA_{11}$ 3522-3526 forms the simulation of the nonlinear map to generate the updated value $x_2$ from state value $x_1$. The circuitry comprising op-amps $OA_{12}$ to $OA_{14}$ 3528-3532 forms the comparator action to generate the recovered logic output $VO_2$. Here $x_2^*=0.4V$ is the threshold reference voltage signal used for SUM logic recovery. The resistor values are used as indicated in the circuit 3500.

Figure 36:
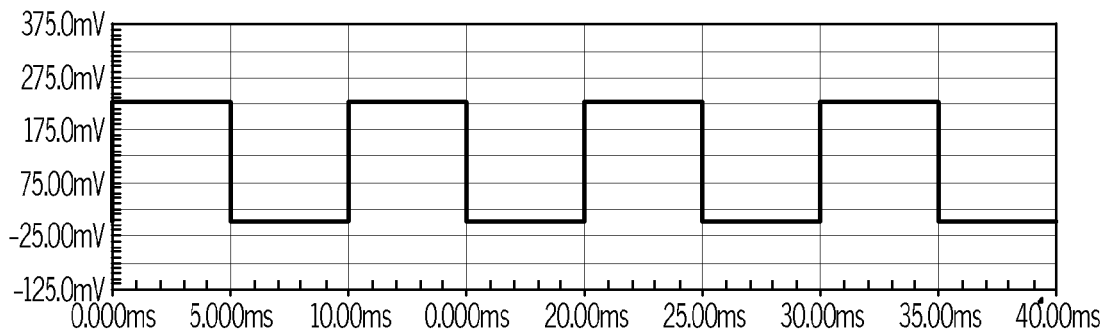
FIGS. 36-42 show the timing sequences for full-adder logic implemented by the circuit of FIG. 35 according to one embodiment of the present invention.
Figure 37:
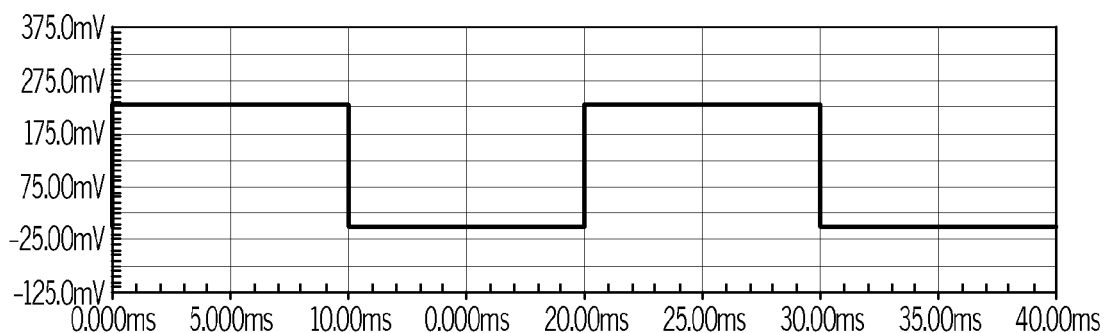
Figure 38:
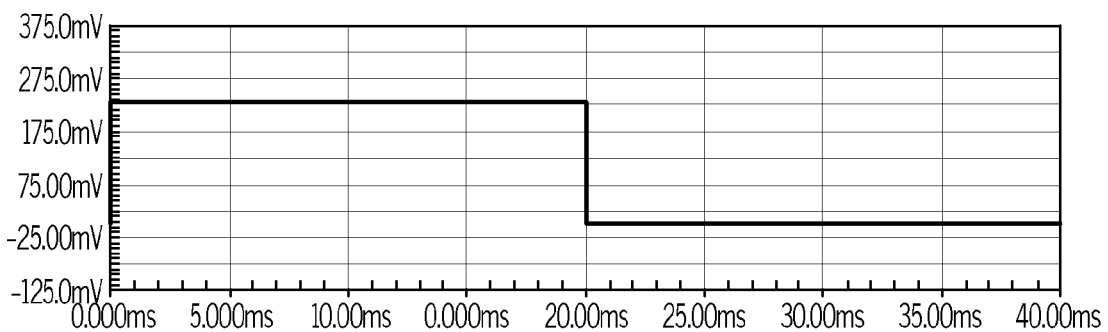
Figure 39:
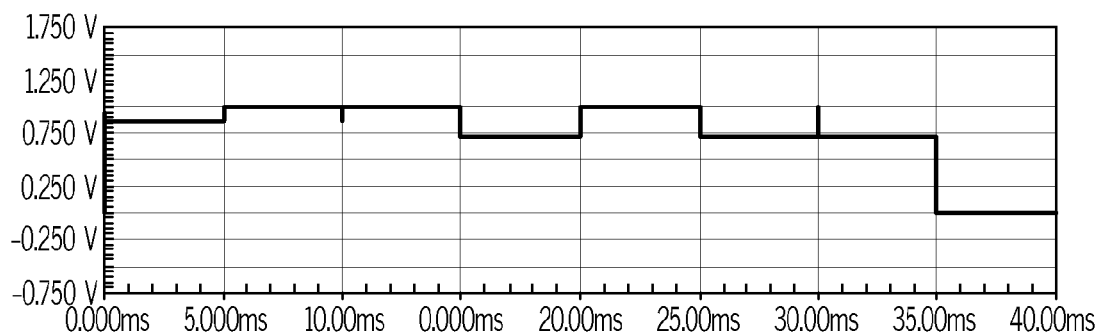
Figure 40:
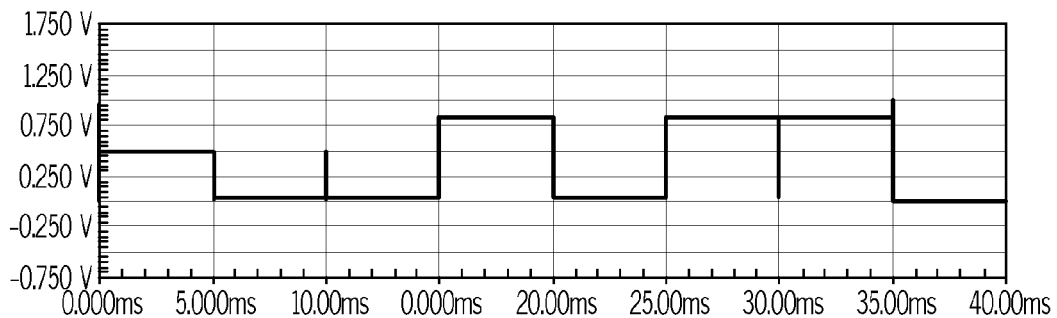
Figure 41:
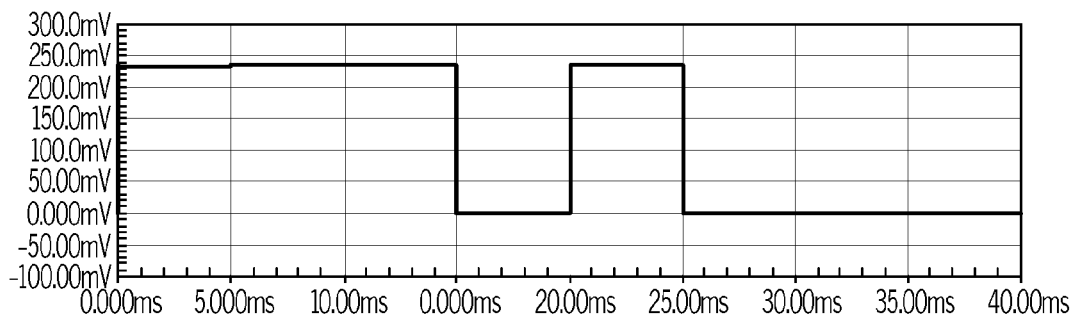
Figure 42:
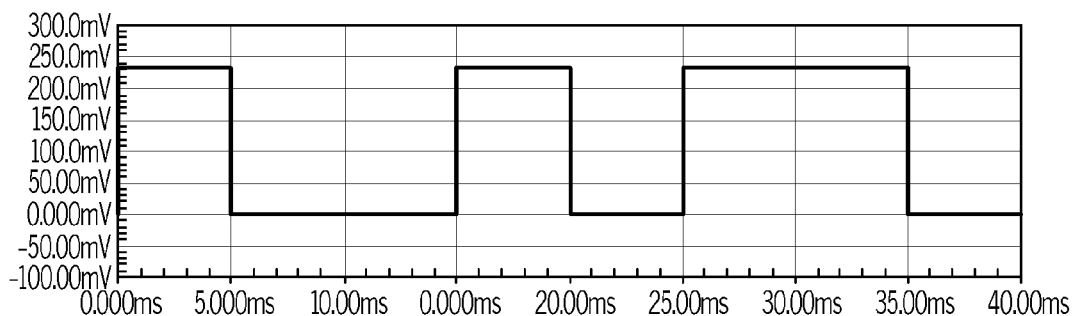

FIGS. 36-42 show timing sequences corresponding to the circuit 3400 in FIG. 34. These waveforms are again straightforwardly obtained in both PSPICE simulation and experiments. FIGS. 35-39 are timing sequences of full-adder logic implemented by the circuit 3500 in FIG. 35 for $x_0=0V$. FIG. 36 shows the timing sequence for a first input $I_1$. FIG. 37 shows the timing sequence for a second input $I_2$. FIG. 38 shows the timing sequence for a third input $I_3$. FIG. 39 shows the timing sequence for an updated state value $x_1$. FIGS. 40-42 are timing sequences of full-adder logic implemented by the circuit 3500 in FIG. 35 for $x_0=0V$. FIG. 40 shows the timing sequence for an updated state value $x_2$. FIG. 41 shows the timing sequence for a recovered CARRY logic signal. FIG. 42 shows the timing sequence for recovered SUM logic signal.

Example of a Process for Dynamically Configuring a Logic Gate

Figure 43:
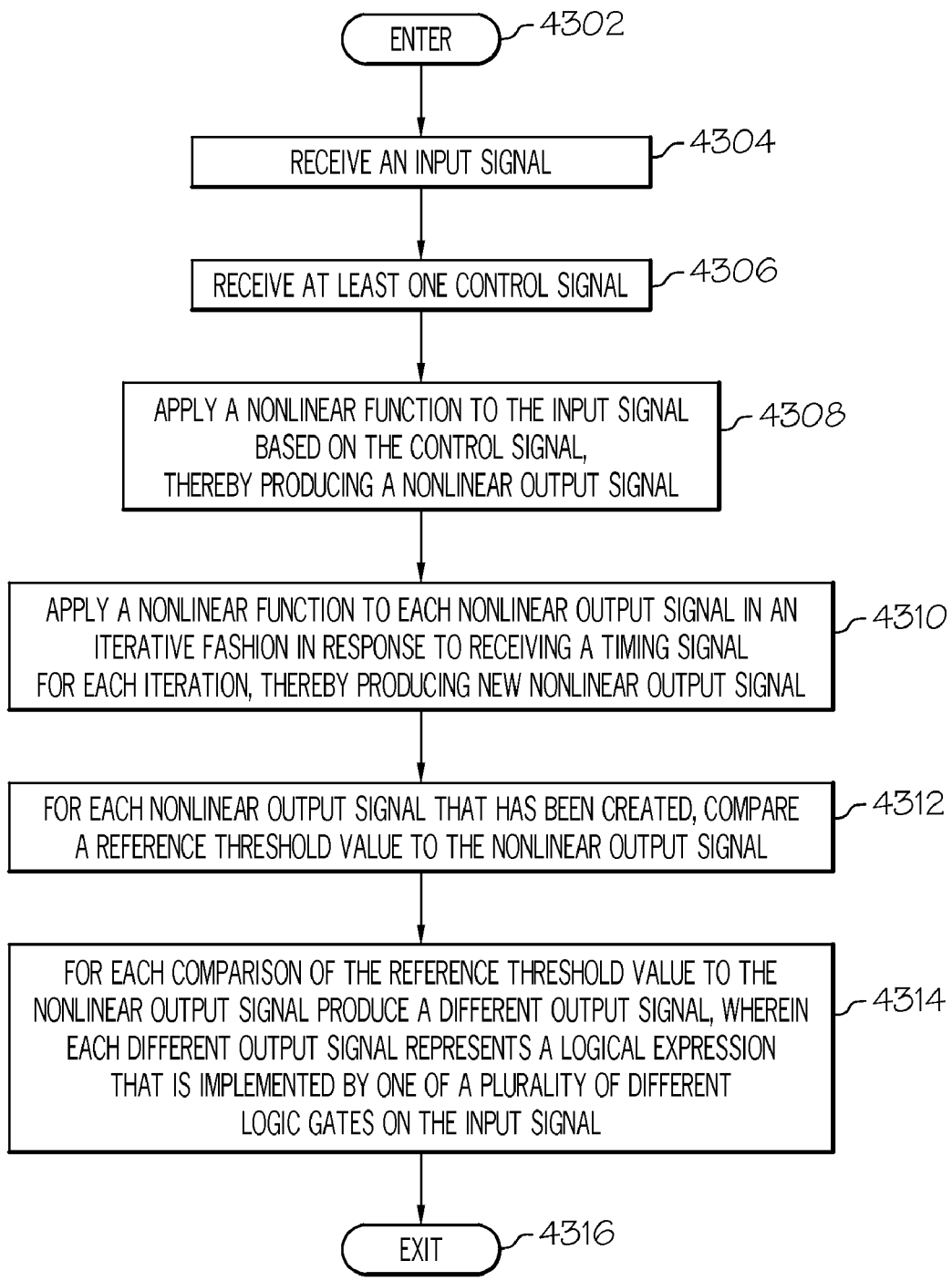
FIG. 43 is an operational flow diagram illustrating one process for obtaining various logic outputs from a nonlinear system based on the time evolution of the state of that system according to one embodiment of the present invention.

FIG. 43 is an operational flow diagram illustrating one process for obtaining various logic outputs from a nonlinear system based on the time evolution of the state of that system. The operational flow diagram of FIG. 43 begins at step 4302 and flows directly to step 4304. The system 100, at step 4304, receives an input signal. The system 100, at step 4306, receives at least one control input signal. At least one of the input signal and the control signal is a noise signal. The system 100, at step 4308, applies a nonlinear function to the input signal based on the control signal, thereby producing a nonlinear output signal. The system 100, at step 430, receives the nonlinear output signal and applies a nonlinear function to each nonlinear output signal in an iterative fashion in response to receiving a timing signal for each iteration. This produces a new nonlinear output signal for each iteration. The system 100, at step 4312, compares, for each nonlinear output signal that has been produces, a reference threshold value to the nonlinear output signal. The system 100, at step 4314, produces, for each comparison, a different output signal. Each different output signal represents a different logical expression that is implemented by on of a plurality of different logic gates on the input signal. The control flow then exits at step 4314.

Non-Limiting Examples

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A logic gate for implementing logical expressions, the logic gate comprising:
   at least one logic gate input for receiving at least one input logic gate signal and at least one control signal;
   at least one output for producing a logic gate output signal;
   a nonlinear updater that operates as a dynamically configurable element to produce a plurality of different logic gates as selected by the control signal, the nonlinear updater electrically coupled to the logic gate input and comprises a nonlinear updater output to provide a nonlinear updater output signal, and configured to apply a nonlinear function to the input logic gate signal in response to the control signal to produce the nonlinear updater output signal representing a logical expression being implemented by one of the plurality of different logic gates on the input logic gate signal; and
   a comparator electrically coupled to the output of the logic gate and the output of the nonlinear updater, wherein the comparator comprises a comparator input adapted to receive a reference threshold value for producing the logical gate output signal based on a comparison of the nonlinear updater output signal to the reference threshold value.

2. The logic gate of claim 1, further comprising:
   a feedback path coupling the nonlinear updater output to a nonlinear updater input, wherein the nonlinear updater is associated with a timing signal to iteratively apply the nonlinear function to the input logic gate signal.

3. The logic gate of claim 2, wherein the nonlinear output signal comprises a current state of the nonlinear updater as a result of iteratively applying the nonlinear function to the input logic gate signal.

4. The logic gate of claim 1, wherein the nonlinear updater output signal represents a different logical expression for each iterative application of the nonlinear function to the input logic gate signal.

5. The logic gate of claim 1, wherein the control signal comprises a global control parameter that is fixed for a given duration corresponding to time period in which the input logic gate signal evolves into the plurality of different logic gates.

6. The logic gate of claim 1, wherein the control signal comprises an initial state of the nonlinear updater.

7. The logic gate of claim 1, wherein the logical gate output corresponds to an AND logic gate.

8. The logic gate of claim 1, wherein the logical gate output corresponds to a NAND logic gate.

9. The logic gate of claim 1, wherein the logical gate output corresponds to an OR logic gate.

10. The logic gate of claim 1, wherein the logical gate output corresponds to a NOR logic gate.

11. The logic gate of claim 1, wherein the logical gate output corresponds to a XNOR logic gate.

12. The logic gate of claim 1, wherein the logical gate output corresponds to a XOR logic gate.

13. The logic gate of claim 1, wherein the logical gate output corresponds to a NOT logic gate.

14. The logic gate of claim 1, wherein the control signal comprises a global control parameter that is fixed for a first given duration corresponding to time period in which the input logic gate signal evolves into the plurality of different logic gates, and wherein after the first given duration the global control parameter is adjusted for a second given duration.

15. A method of changing functionality of a logic gate, the method comprising:
    receiving at least one input logic gate signal and at least one control signal;
    operating a nonlinear updater as a dynamically configurable element to produce a plurality of different logic gates as selected by the control signal;
    applying a nonlinear function to the input logic gate signal in response to the control signal;
    producing, in response to the applying, a nonlinear updater output signal representing a logical expression being implemented by one of the plurality of different logic gates on the input logic gate signal;
    operating a comparator electrically coupled to an output of the logic gate and an output of the nonlinear updater, wherein the comparator comprises an input adapted to receive a reference threshold value;
    comparing, in response to the operating, the nonlinear output signal to the reference threshold value; and
    producing, in response to the comparing, a logical gate output signal.

16. The method of claim 15, further comprising:
    coupling the output of the nonlinear updater an input of the nonlinear updater;
    receiving, by the nonlinear updater, a timing signal; and
    iteratively applying, by the nonlinear updater, the nonlinear function to the input logic gate signal.

17. The method of claim 15,
    fixing a global parameter at the comparator for a given duration corresponding to time period in which the input logic gate signal evolves into the plurality of different logic gates.

* * * * *